(12) United States Patent
Ryoki et al.

(10) Patent No.: US 11,742,373 B2
(45) Date of Patent: Aug. 29, 2023

(54) SEMICONDUCTOR DEVICE AND METHOD OF MANUFACTURING SEMICONDUCTOR DEVICE

(71) Applicant: CANON KABUSHIKI KAISHA, Tokyo (JP)

(72) Inventors: Tatsuya Ryoki, Kawasaki (JP); Hirofumi Totsuka, Fujisawa (JP); Masahiro Kobayashi, Tokyo (JP); Hideaki Ishino, Tokyo (JP); Hiroaki Kobayashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 150 days.

(21) Appl. No.: 17/175,447

(22) Filed: Feb. 12, 2021

(65) Prior Publication Data

US 2021/0167113 A1    Jun. 3, 2021

Related U.S. Application Data

(63) Continuation of application No. 16/269,054, filed on Feb. 6, 2019, now Pat. No. 10,957,732.

(30) Foreign Application Priority Data

Feb. 9, 2018    (JP) .................. 2018-022399

(51) Int. Cl.
*H01L 27/146* (2006.01)
*H01L 27/148* (2006.01)

(52) U.S. Cl.
CPC .... *H01L 27/14634* (2013.01); *H01L 27/1469* (2013.01); *H01L 27/14607* (2013.01); *H01L 27/14636* (2013.01); *H01L 27/14806* (2013.01)

(58) Field of Classification Search
CPC ......... H01L 27/14634; H01L 27/14636; H01L 27/14806
USPC ........................................ 257/225
See application file for complete search history.

(56) References Cited

U.S. PATENT DOCUMENTS

| | | | |
|---|---|---|---|
| 2015/0179691 A1 | 6/2015 | Yanagita et al. | |
| 2016/0293662 A1 | 10/2016 | Soda et al. | |
| 2017/0077169 A1* | 3/2017 | Masuda | H01L 27/14645 |
| 2018/0007305 A1 | 1/2018 | Yamashita et al. | |

FOREIGN PATENT DOCUMENTS

| | | |
|---|---|---|
| JP | 2012-256736 A | 12/2012 |
| JP | 2013-179313 A | 9/2013 |
| JP | 2015-195235 A | 11/2015 |
| JP | 2017-117828 A | 6/2017 |

* cited by examiner

*Primary Examiner* — Dzung Tran
(74) *Attorney, Agent, or Firm* — Canon U.S.A., Inc., IP Division

(57) ABSTRACT

A semiconductor device in which a first chip and a second chip are stacked including a first wiring line and a second wiring line by which the first chip and the second chip are electrically connected. The first wiring line and the second wiring line each include a bonding portion for bonding one of a plurality of conductive patterns placed in the first chip and one of a plurality of conductive patterns placed in the second chip. The number of bonding portions included in the first wiring line is larger than the number of bonding portions included in the second wiring line.

30 Claims, 13 Drawing Sheets

SEMICONDUCTOR DEVICE AND METHOD OF MANUFACTURING SEMICONDUCTOR DEVICE

CROSS-REFERENCE TO RELATED APPLICATIONS

This application is continuation of U.S. application Ser. No. 16/269,054 filed Feb. 6, 2019, which claims the benefit of Japanese Patent Application No. 2018-022399, filed Feb. 9, 2018, the disclosures of each of which are hereby incorporated by reference herein in their entirety.

BACKGROUND OF THE INVENTION

Field of the Invention

The present disclosure relates to a semiconductor device in which a plurality of chips are stacked.

Description of the Related Art

In a semiconductor device in which a plurality of chips are stacked, conductive patterns of the chips may be bonded to each other to form wiring for electric connection between the chips via bonding portions at which the conductive patterns are bonded.

In Japanese Patent Application Laid-Open No. 2013-118345, there is disclosed a solid-state image pickup device in which a first semiconductor substrate and a second semiconductor substrate are arranged on top of each other and conductive patterns of the semiconductor substrates are connected to each other. The disclosure also includes the use of different numbers of contact plugs in a pixel array as first contact plugs of the first semiconductor substrate and second contact plugs of the second semiconductor substrate.

Japanese Patent Application Laid-Open No. 2013-118345 does not present a thorough investigation on efficient utilization of the bonding portions.

SUMMARY OF THE INVENTION

An aspect of the present disclosure is to provide a technology advantageous in improving the performance of a semiconductor device by providing a plurality of wiring types. Further features of the present disclosure will become apparent from the following description of exemplary embodiments with reference to the attached drawings.

DESCRIPTION OF THE EMBODIMENTS

An embodiment of the present disclosure is described below with reference to the drawings. In the following description and the drawings, a component common to a plurality of drawings is denoted by a common symbol. The common component is therefore described by cross-referring to the plurality of drawings, and a description on components denoted by a common symbol is omitted as appropriate. The disclosure of the embodiment encompasses not only what is specified herein, but all matters that can be grasped from the specification and from the accompanying drawings. Components having the same name but denoted by different symbols may be differentiated from one another by referring to the component as, for example, "first component", "second component", and "third component".

Figure 1A:
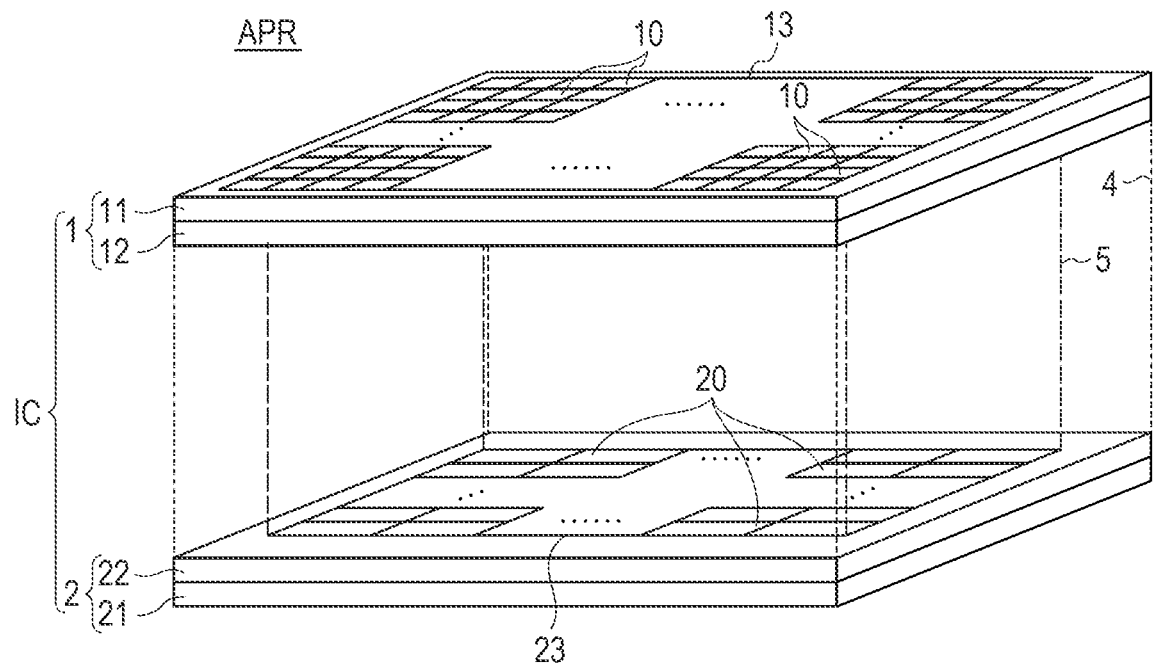
FIG. 1A and FIG. 1B are diagrams for illustrating a semiconductor device.

FIG. 1A is a diagram of a semiconductor device APR. All or part of the semiconductor device APR is a semiconductor device IC, which is a laminate of a chip 1 and a chip 2. The semiconductor device APR in this example is a photoelectric conversion device applicable as an image sensor, an auto focus (AF) sensor, a photometric sensor, a ranging sensor, or the like. The chip 1 on which a plurality of cells 10 are arranged in matrix and the chip 2 on which a plurality of cells 20 are arranged in matrix are stacked in the semiconductor device APR. The cells 20 may include P-type transistors and N-type transistors. Lines 4 in FIG. 1A indicate that the chip 1 and the chip 2 are stacked with the outlines of the chip 1 and the chip 2 substantially matched. The chip 1 has an area 13 in which the plurality of cells 10 are arranged in matrix, and the chip 2 has an area 23 in which the plurality of cells 20 are arranged in matrix. The area 13 and the area 23 overlap with each other in an overlap area 5. The entire area 13 and the entire area 23 may overlap, a part of the area 13 may not overlap with the area 23, and a part of the area 23 may not overlap with the area 13. While a case in which the area 13 and the area 23 have an equal planar dimension, the area 13 and the area 23 may have different planar dimensions.

The chip 1 includes a semiconductor layer 11 provided with a plurality of semiconductor elements (not shown), which are components of the plurality of cells 10, and a wiring structure 12 including M wiring layers (not shown), which are components of the plurality of cells 10. The chip 2 includes a semiconductor layer 21 provided with a plurality of semiconductor elements (not shown), which are components of the plurality of cells 20, and a wiring structure 22 including N wiring layers (not shown), which are components of the plurality of cells 20. The wiring structure 12 is interposed between the semiconductor layer 11 and the semiconductor layer 21. The wiring structure 22 is interposed between the wiring structure 12 and the semiconductor layer 21.

The cells 10 are each a pixel circuit including a photodiode or a similar photoelectric conversion element and a transistor or a similar active element, details of which are described later. The cells 20 are each an electric circuit configured to drive one of the cells 10 and to process a signal from the cell 10.

Figure 1B:
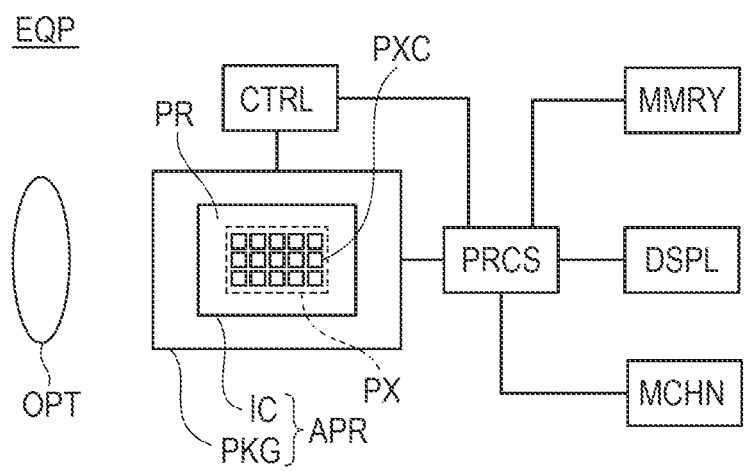

FIG. 1B is a diagram of an equipment EQP, which includes the semiconductor device APR. The semiconductor device IC has a pixel area PX, in which pixels PXC including the cells 10 are arranged in matrix. The pixels PXC may include microlenses and color filters in addition to photoelectric conversion elements included in the cells 10. The semiconductor device IC may have a perimeter area PR around the pixel area PX. Circuits other than the cells 10 may be placed in the perimeter area PR. The semiconductor device APR may include, in addition to the semiconductor device IC, a package PKG in which the semiconductor device IC is stored. The equipment EQP may further include at least one of an optical system OPT, a controller CTRL, a processor PRCS, a display DSPL, a memory MMRY, or a mechanical apparatus MCHN. Details of the equipment EQP are described later.

Figure 2:
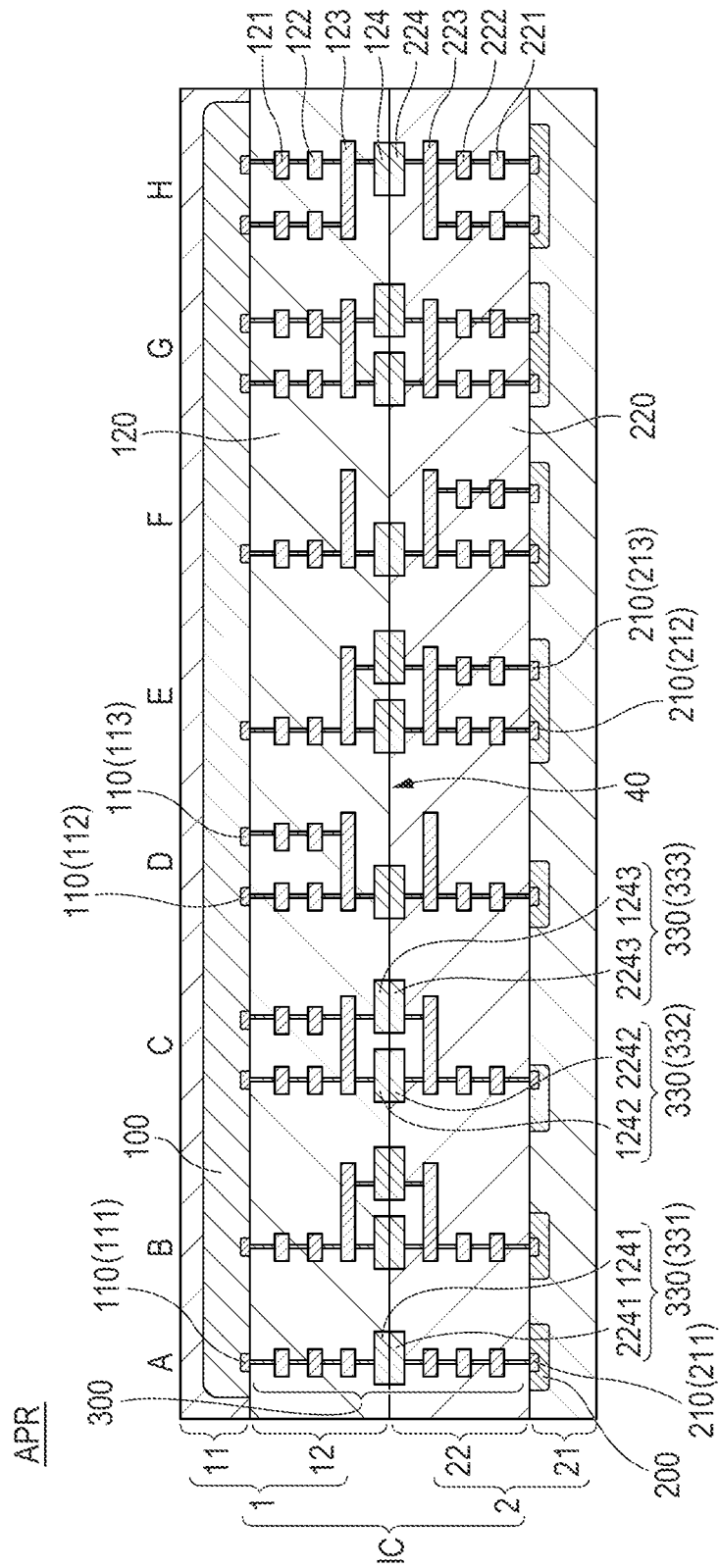
FIG. 2 is a view for illustrating the semiconductor device.

FIG. 2 is a sectional view of the semiconductor device APR in which the overlap area 5 illustrated in FIG. 1A is included. The wiring structure 12 includes, as M wiring layers (M=4 in this example), wiring layers 121, 122, 123, and 124. An interlayer insulating film 120 is formed around the plurality of wiring layers, 121, 122, 123, and 124. The topmost wiring layer is the wiring layer 124. The wiring layer 124 includes a plurality of conductive patterns 1241, 1242, and 1243 placed in the chip 1. The wiring structure 22 includes, as N wiring layers (N=4 in this example), wiring layers 221, 222, 223, and 224. An interlayer insulating film 220 is formed around the plurality of wiring layers, 221, 222, 223, and 224. The topmost wiring layer is the wiring layer 224. The wiring layer 224 includes a plurality of conductive patterns 2241, 2242, and 2243 placed in the chip 2.

A plurality of wiring lines 300 (inter-chip wiring) are formed from the wiring structures 12 and 22 between the semiconductor layer 11 and the semiconductor layer 21 for electric connection between the chip 1 and the chip 2. The chip 1 and the chip 2 may each have wiring only for the inside of the chip (intra-chip wiring) as well, but a description on intra-chip wiring is omitted here. Each of the plurality of wiring lines 300 has a bonding portion 330 for bonding one of the plurality of conductive patterns 1241, 1242, and 1243 placed in the chip 1, and one of the plurality of conductive patterns 2241, 2242, and 2243 placed in the chip 2 are bonded. For example, the conductive pattern 1241 and the conductive pattern 2241 are bonded at a bonding portion 331 out of the plurality of bonding portions 330. The conductive pattern 1242 and the conductive pattern 2242 are bonded at a bonding portion 332 out of the plurality of bonding portions 330. The conductive pattern 1243 and the conductive pattern 2243 are bonded at a bonding portion 333 out of the plurality of bonding portions 330. Electric connection is established between the bonding portions 330 and contacts 110 of the semiconductor layer 11 through the intermediation of the other wiring layers 121, 122, and 123. Electric connection is established between the bonding portions 330 and contacts 210 of the semiconductor layer 21 through the intermediation of the other wiring layers 221, 222, and 223. This forms electric connection between the chip 1 and the chip 2. The interlayer insulating film 120 and the interlayer insulating film 220 are bonded in order to reinforce mechanical connection between the chip 1 and the chip 2. The bonding between the conductive patterns and the bonding between the interlayer insulating films are formed on a bonding surface 40.

A feature of the embodiment is that the wiring lines 300 of a plurality of types are provided in the overlap area 5. In FIG. 2, eight types of wiring lines 300, namely, Types A, B, C, D, E, F, G, and H, are illustrated as an example of the types of the wiring lines 300. The Type A wiring line 300, for example, is configured so as to include one bonding portion 331. The Type C wiring line 300, for example, is configured so as to include two bonding portions 332 and 333. The Type D wiring line 300, for example, is configured so as to include two contacts 112 and 113. The Type E wiring line 300, for example, is configured so as to include two contacts 212 and 213.

For each type of the wiring lines 300, the number of contacts 110, bonding portions 330, or contacts 210 included in the type is shown in Table 1. In each of the Type A, Type B, Type C, Type D, Type E, Type F, Type G, and Type H wiring lines 300 out of the plurality of wiring lines 300, the number of contacts 110 between the wiring line 300 of the type and the semiconductor layer 11 of the chip 1 is given as X. In each of the Type A, Type B, Type C, Type D, Type E, Type F, Type G, and Type H wiring lines 300 out of the plurality of wiring lines 300, the number of bonding portions 330 included in the wiring line 300 of the type is given as Y. In each of the Type A, Type B, Type C, Type D, Type E, Type F, Type G, and Type H wiring lines 300 out of the plurality of wiring lines 300, the number of contacts 210 between the wiring line 300 of the type and the semiconductor layer 21 of the chip 2 is given as Z.

In Table 1, possible values of the numbers X, Y, and Z in each of the Type A, Type B, Type C, Type D, Type E, Type F, Type G, and Type H wiring lines 300 are schematically shown as "S" and "L". The values S and L have a relation of 1≤S<L. While S is 1 and L is 2 in the example of FIG. 2, S and L may be, for example, 2 and 3, respectively.

TABLE 11

| Type\Number | A | B | C | D | E | F | G | H |
|---|---|---|---|---|---|---|---|---|
| X | S | S | L | L | S | S | L | L |
| Y | S | L | L | S | L | S | L | S |
| Z | S | S | S | S | L | L | L | L |
| X/Y | = | − | = | + | − | = | = | + |
| Z/Y | = | − | − | = | = | + | = | + |

In each of the Type A, Type B, Type C, Type D, Type E, Type F, Type G, and Type H wiring lines 300, the ratio of X as the number of contacts 110 between the wiring line 300 of the type and the semiconductor layer 11 of the chip 1 to Y as the number of bonding portions 330 included in the wiring line 300 of the type is expressed as X/Y. A value "+" is written for a type that satisfies X/Y>1 (i.e., X>Y). A value "=" is written for a type that satisfies X/Y=1 (i.e., X=Y). A value "−" is written for a type that satisfies X/Y<1 (i.e., X<Y).

In each of the Type A, Type B, Type C, Type D, Type E, Type F, Type G, and Type H wiring lines 300, the ratio of Z as the number of contacts 210 between the wiring line 300 of the type and the semiconductor layer 21 of the chip 2 to Y as the number of bonding portions 330 included in the wiring line 300 of the type is expressed as Z/Y. A value "+" is written for a type that satisfies Z/Y>1 (i.e., Z>Y). A value "=" is written for a type that satisfies Z/Y=1 (i.e., Z=Y). A value "−" is written for a type that satisfies Z/Y<1 (i.e., Z<Y).

As shown in Table 1, the value of X/Y is "+" for Type D and Type H, "=" for Type A, Type C, Type F, and Type G, and "−" for Type B and Type E. The value of Z/Y is "+" for Type F and Type H, "=" for Type A, Type D, Type E, and Type G, and "−" for Type B and Type C.

At least two types of wiring lines 300 are allowed to be provided in the overlap area 5 out of the Type A, Type B, Type C, Type D, Type E, Type F, Type G, and Type H wiring lines 300. In that case, Y as the number of bonding portions included in one wiring line 300 out of the plurality of wiring lines 300 in the overlap area 5 is larger than Y as the number of bonding portions included in another wiring line 300 out of the plurality of wiring lines 300 in the overlap area 5. As shown in Table 1, the value of Y is L for Type B, Type C, Type E, and Type G, and S for Type A, Type D, Type F, and Type H. It accordingly suffices to provide the overlap area 5 with the wiring line 300 of one of Type B, Type C, Type E, and Type G and the wiring line 300 of one of Type A, Type D, Type F, and Type H. In this manner, the reliability and the characteristics can be optimized for each wiring line 300 separately by varying the value of Y as the number of bonding portions in a single wiring line 300 for each wiring line 300. For instance, the wiring line 300 including a larger number of bonding portions is lower in resistance. Meanwhile, the wiring line 300 including a larger number of bonding portions is larger in parasitic capacitance.

At least two types of wiring lines 300 are allowed to be provided in the overlap area 5 out of the Type A, Type B, Type C, Type D, Type E, Type F, Type G, and Type H wiring lines 300. In that case, the ratio X/Y in one wiring line 300 out of the plurality of wiring lines 300 in the overlap area 5 is higher than the ratio X/Y in another wiring line 300 out of the plurality of wiring lines 300 in the overlap area 5. It accordingly suffices to provide the overlap area 5 with the wiring line 300 of one of Type D and Type H and the wiring line 300 of one of Type B and Type E. The overlap area 5 may instead be provided with the wiring line 300 of one of Type D and Type H and the wiring line 300 of one of Type A, Type C, Type F, and Type G. The overlap area 5 may instead be provided with the wiring line 300 of one of Type A, Type C, Type F, and Type G and the wiring line 300 of one of Type B and Type E. In this manner, how the wiring lines 300 are branched and how a bonding portion is shared can be optimized by varying the ratio X/Y in a single wiring line 300 for each wiring line 300.

The numbers X and Y indicating the numbers of contacts may each be the number of transistors to which a single wiring line 300 is connected. The number of transistors of the chip 1 that are connected to one wiring line 300 is given as X and the number of bonding portions 330 included in the one wiring line 300 is given as Y. The number of transistors of the chip 2 that are connected to another wiring line 300 is given as Z, and the number of bonding portions 330 included in the other wiring line 300 is given as Y. The ratio X/Y is higher than the ratio Z/Y in this case.

In Table 2, an example of the types of the wiring lines 300 other than the types shown in Table 1 is shown. The difference from the example of Table 1 is that a value M is considered in addition to the value S and the value L. The types shown in Table 2 are specifically "AF", "J", "JK", "K", "BE", "P", "PQ", "Q", "R", "RT", "TU", "U", "UV", "V", "DH", "HW", "W", "WC", and "CG". The values S, M, and L have a relation S<M<L. In Table 2, a value "+" is written for a type that satisfies Z>Y, a value "=" is written for a type that satisfies Z=Y, and a value "−" is written for a type that satisfies Z<Y. Through use of a type of wiring line 300 in which the number X, the number Y, and the number Z have values different from one another, for example, Type K, inter-chip wiring can be optimized. Inter-chip wiring can be optimized also by using three or more types as at least one of the numbers X, Y, and Z in each wiring line 300.

TABLE 21

| Type\Number | AF | J | JK | K | BE | P | PQ | Q | R | RT | TU | U | UV | V | DH | HW | W | WC | CG |
|---|---|---|---|---|---|---|---|---|---|---|---|---|---|---|---|---|---|---|---|
| X | S | S | S | S | S | M | M | M | M | M | M | M | M | L | L | L | L | L | L |
| Y | S | M | M | M | L | S | S | S | M | M | M | L | L | L | S | M | M | M | L |
| Z | M | S | M | L | M | S | M | L | S | M | L | S | M | L | M | S | M | L | M |
| Y/X | = | + | + | + | + | − | − | − | = | = | = | + | + | + | − | − | − | − | = |
| Z/Y | + | − | = | + | − | = | + | + | − | = | + | − | − | = | + | − | = | + | − |

More specific configurations of the cells 10 and the cells 20 and favorable combinations of the wiring lines 300 connected to the cells 10 and 20 are described with reference to FIG. 3.

Each cell 10 includes a photoelectric converter 104, a charge detector 105 configured to detect the charge of the photoelectric converter 104, and a transfer gate 107 configured to transfer the charge of the photoelectric converter 104 to the charge detector 105. The photoelectric converter 104 is, for example, a photodiode, and the charge detector 105 is, for example, a floating diffusion node. The transfer gate 107 is, for example, a MOS gate. A transfer signal is input to the transfer gate 107 from a transfer signal line PTX, and the turning on/off of the transfer gate 107 is controlled by the level of the transfer signal. The cell 10 may include a reset transistor 102 configured to reset the electric potential of the charge detector 105. A reset signal is input to a gate of the reset transistor 102 from a reset signal line PRES, and the turning on/off of the reset transistor 102 is controlled by the level of the reset signal. A reset potential is input to a source/drain of the reset transistor 102 from a reset potential supplier VRES of the charge detector 105. The cell 10 may include a detection transistor 103, which has a gate connected to the charge detector 105. The electric potential of the charge detector 105 is input to the gate of the detection transistor 103. The cell 10 may include a discharge transistor 101 configured to discharge the photoelectric converter 104. The discharge transistor 101 is, for example, an overflow drain. A discharge signal is input to a gate of the discharge transistor 101 from a discharge signal line OFG, and the turning on/off of the discharge transistor 101 is controlled by the level of the discharge signal. A discharge potential is input to a source/drain of the discharge transistor 101 from a discharge potential supplier VOFD for resetting (for performing photodiode reset) the photoelectric converter 104.

In the cell 10, the transfer gate 107 transfers a charge generated in the photoelectric converter 104 to the charge detector 105. The reset transistor 102 resets the charge detector 105 after reading a signal. The discharge transistor 101 is used to discharge charges of the photoelectric converter 104, and determines the start of an accumulation time.

Specifically, accumulation is started when the discharge transistor 101 is turned on. The transfer gate 107 is turned on to transfer charges from the photoelectric converter 104 to the charge detector 105, and accumulation is ended when the transfer gate 107 is turned off. Through execution of the operation described above concurrently for a plurality of pixels, global shutter operation is accomplished. The present disclosure, however, is not limited to the operation described above, and each pixel may be driven individually.

Each cell 20 includes a part of a comparator, which includes a differential pair. The comparator performs ramp signal comparison-type AD conversion. The comparator includes a transistor 201, which is a tail current source connected to the differential pair, and transistors 202 and 203, which are current mirrors connected to the differential pair. The detection transistor 103, which is one of input transistors of the differential pair, is included in the cell 10, and a reference transistor 204, which is the other of the input transistors of the differential pair, is included in the cell 20. The reference transistor 204 is included in the cell 20 in this example, but may be included in the cell 10. A ramp signal RAMP as a reference signal is input to a gate of the reference transistor 204. An output signal from an output line OUT of the comparator is inverted depending on the result of a comparison between the electric potential at the gate of the detection transistor 103 and the electric potential at the gate of the reference transistor 204. A latch 205 is connected to the output line OUT, and generates a latch pulse at the time when the output signal is switched. A memory (not shown), to which a count signal is input, is provided downstream of the latch 205, and a count signal is taken into the memory in accordance with the timing of the latch pulse. The count signal taken into the memory acts as a digitized pixel signal. The comparator, the latch 205, and the memory make up an AD conversion circuit. The memory of the AD conversion circuit may or may not be included in the cell 20, and may be provided on a chip separate from the chips 1 and 2.

Figure 3:
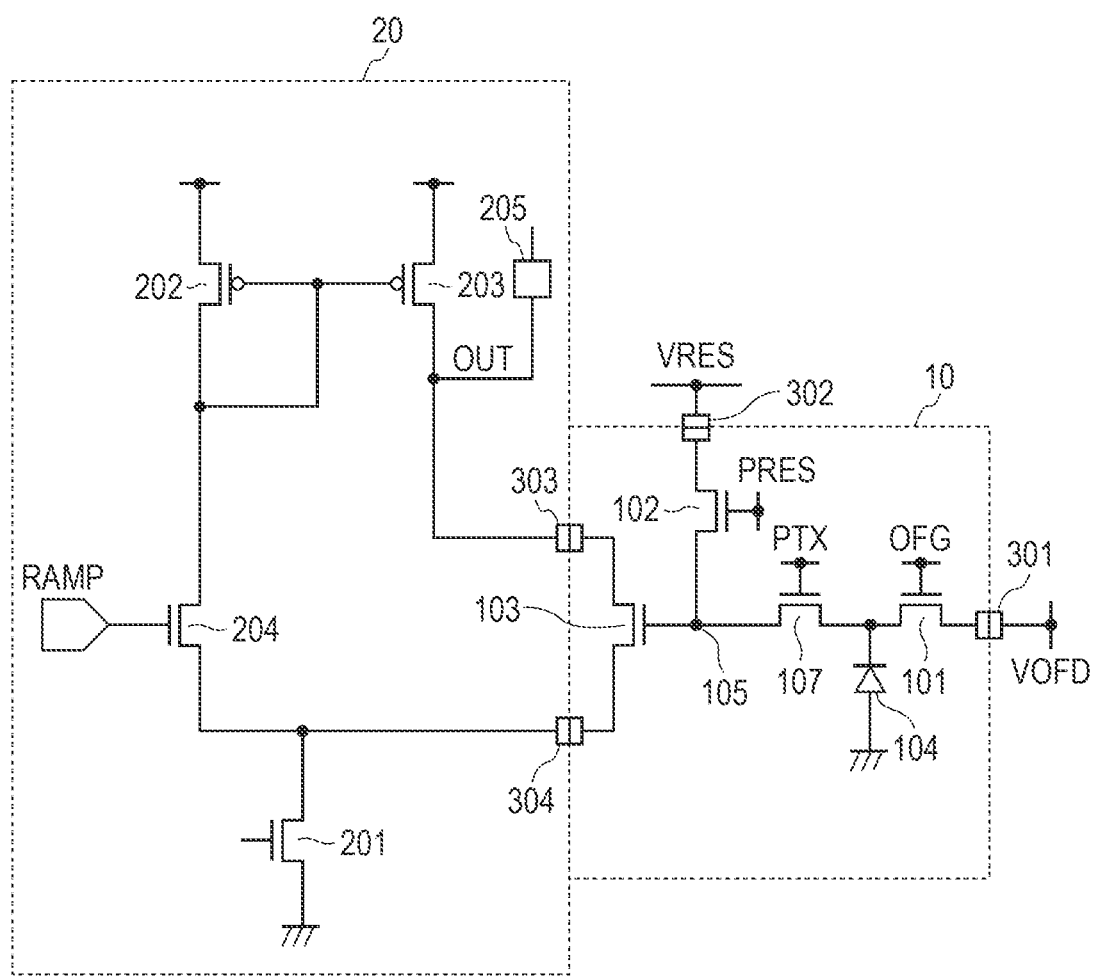
FIG. 3 is a diagram for illustrating the semiconductor device.

In FIG. 3, wiring lines 301, 302, 303, and 304 are illustrated as the wiring lines 300 between the chips. The wiring line 301 connects the discharge potential supplier VOFD and the discharge transistor 101. The wiring line 302 connects the reset potential supplier VRES and the reset transistor 102. The wiring line 303 connects the detection transistor 103 and the transistor 203. The wiring line 304 connects the detection transistor 103, the reference transistor 204, and the transistor 201.

Specific structures of the wiring lines 301, 302, 303, and 304 are described below.

Figure 4A:
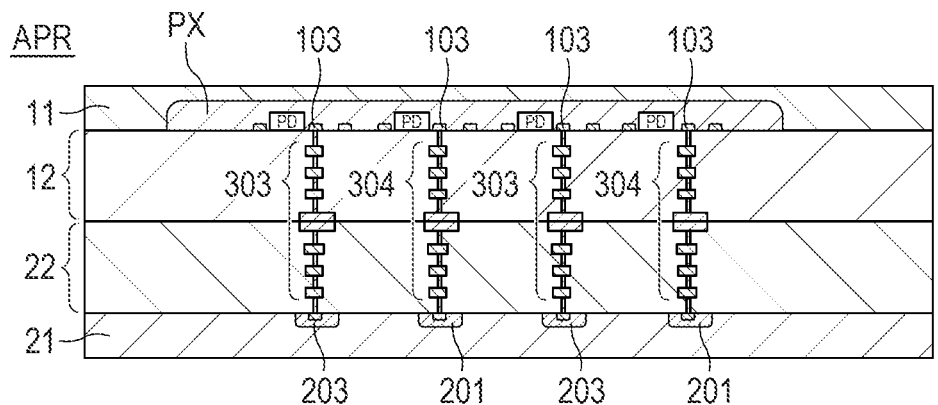
FIG. 4A, FIG. 4B, and FIG. 4C are views for illustrating the semiconductor device.

The wiring lines 303 and 304 are illustrated in FIG. 4A. The wiring lines 303 and 304 are the Type A wiring lines 300 illustrated in FIG. 2. The contacts 110 each correspond to a source/drain of the detection transistor 103. The contacts 210 each correspond to a source/drain of the transistor 201, 202, 203, or 204. For a single wiring line 303 or 304, one of the contacts 110 of the chip 1 is connected to one bonding portion 330. In FIG. 4A, a contact of the detection transistor 103 is illustrated as one of the contacts 110, and contacts of the transistors 201 and 203 are illustrated as the contacts 210. One cell 20 is placed for each cell 10, and conductive patterns of the bonding portions 330 are accordingly placed in the overlap area 5. In the case of the wiring lines 303 and 304 along which an analog signal is transmitted, the number of bonding portions 330 is desirably small (S bonding portions 330) in order to reduce the parasitic capacitances of the wiring lines 303 and 304.

Figure 4B:
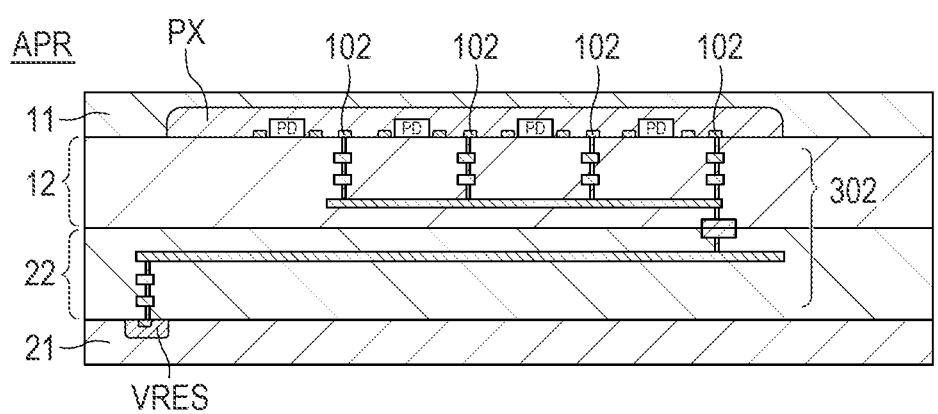

The wiring line 302 is illustrated in FIG. 4B. The wiring line 302 is the Type D wiring line 300 illustrated in FIG. 2. The contacts 110 each correspond to the source/drain of the reset transistor 102, and the contacts 210 each correspond to the reset potential supplier VRES. The reset potential supplier VRES is, for example, a protective element provided in a pad portion. In this example, the reset potential is not required to vary from one cell 10 to another, and can accordingly be shared by a plurality of cells 10. In addition, the number of patterns of the bonding portions 330 is limited because of limitations on the planar dimension of the layout. The capacitance of the charge detector 105 is not large as well, and a reset accordingly causes only small fluctuations, which means that a minimum number of patterns of the bonding portions 330 suffices, and that the number of bonding portions 330 is desirably small (S bonding portions 330) as illustrated in FIG. 4B. The number of conductive patterns between the reset potential supplier VRES and the bonding portions 330 can also be reduced, and a voltage drop of the reset potential can accordingly be decreased by increasing the widths of the conductive patterns or by other measures. Stable operation is accomplished as a result.

Figure 4C:
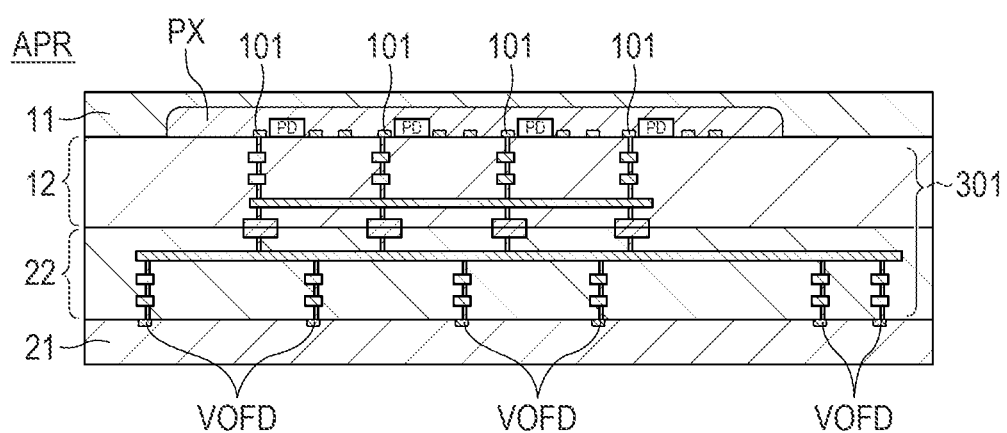

The wiring line 301 is illustrated in FIG. 4C. The wiring line 301 is the Type AF, or Type TU, wiring line 300 shown in Table 2. The contacts 110 each correspond to the discharge transistor 101, and the contacts 210 each correspond to the discharge potential supplier VOFD.

A plurality of bonding portions 330 are connected to a plurality of discharge transistors 101. The discharge transistors 101 are driven at the same time for all pixels in some cases, and power fluctuations are accordingly large. In that case, the use of a large number of contacts 210 (L contacts 210) is desirable in order to connect at a low resistance and reduce the fluctuations.

Figure 5A:
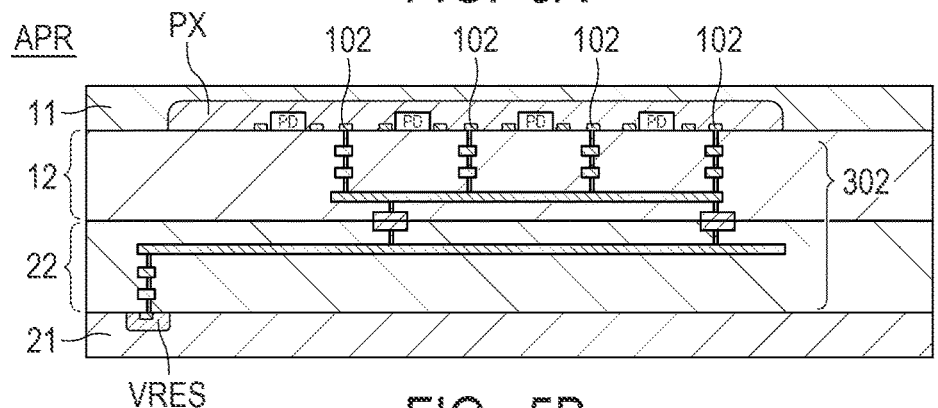
FIG. 5A, FIG. 5B, FIG. 5C, and FIG. 5D are views for illustrating the semiconductor device.
Figure 5B:
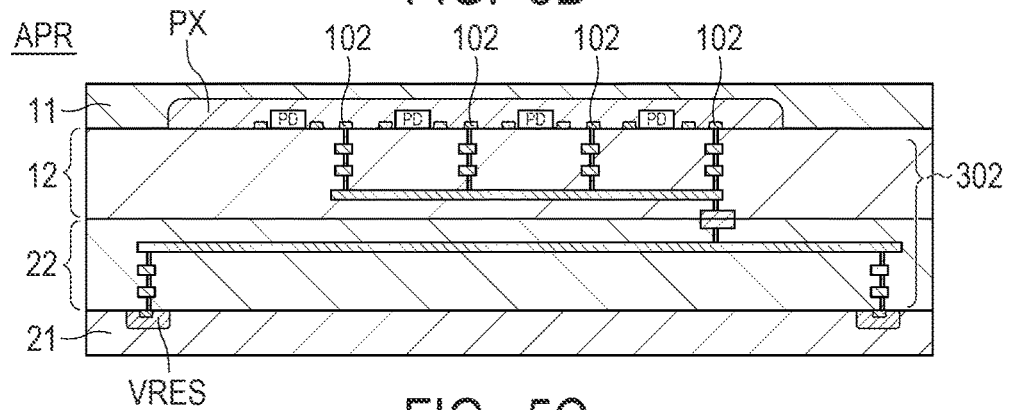
Figure 5C:
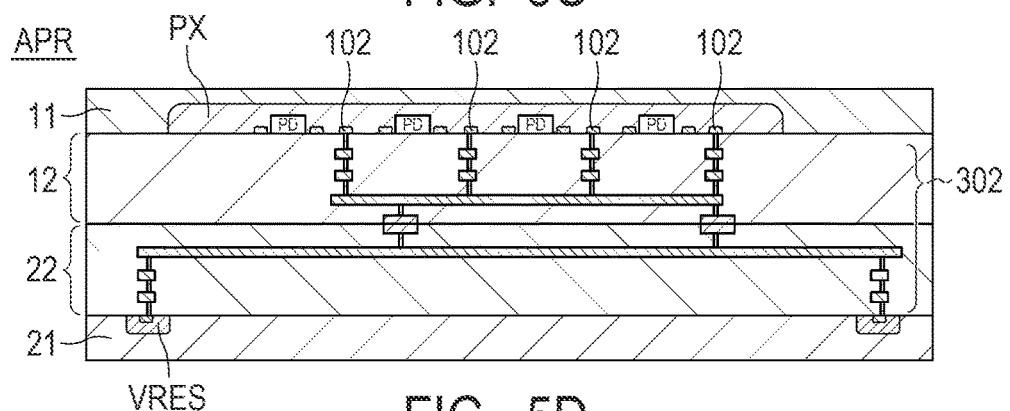

FIG. 5A to FIG. 5C are each a view for illustrating the wiring line 302. The contacts 110 each correspond to the source/drain of the reset transistor 102, and the contacts 210 each correspond to the reset potential supplier VRES. The wiring line 302 of FIG. 5A is the Type HW wiring line 300 shown in Table 2. To L reset transistors 102, S reset potential suppliers VRES are connected at a plurality of bonding portions 330. The resistance can be lowered by increasing the number of bonding portions 330, the wiring line 300 of FIG. 5A may accordingly be employed when the arrangement of FIG. 5A is adoptable in other configurations. The wiring line 302 of FIG. 5A may also be, for example, the Type C, Type R, or Type CG wiring line 300 in one of Table 1 and Table 2.

The wiring line 302 of FIG. 5B is the Type DH wiring line 300 shown in Table 2. A plurality of reset potential suppliers VRES are connected to a plurality of reset transistors 102 via a single bonding portion 330. This arrangement may be employed when there are a plurality of pads for supplying a reset potential. With the type DH wiring line 300, a local power drop can be decreased when the planar dimensions of the chips are large. The wiring line 302 of FIG. 5B may also be, for example, the Type H, Type PQ, or Type WC wiring line in one of Table 1 and Table 2.

The wiring line 302 of FIG. 5C is the Type D wiring line 300 shown in Table 1. A plurality of reset potential suppliers VRES are connected to a plurality of reset transistors 102 via a plurality of bonding portions 330. This arrangement may be employed when there are a plurality of pads for supplying a reset potential. With the type D wiring line 300, a local power drop can be decreased when the planar dimensions of the chips are large, and the resistance is consequently lowered. The wiring line 302 of FIG. 5C may also be, for example, the Type P or Type W wiring line 300 in one of Table 1 and Table 2.

Figure 5D:
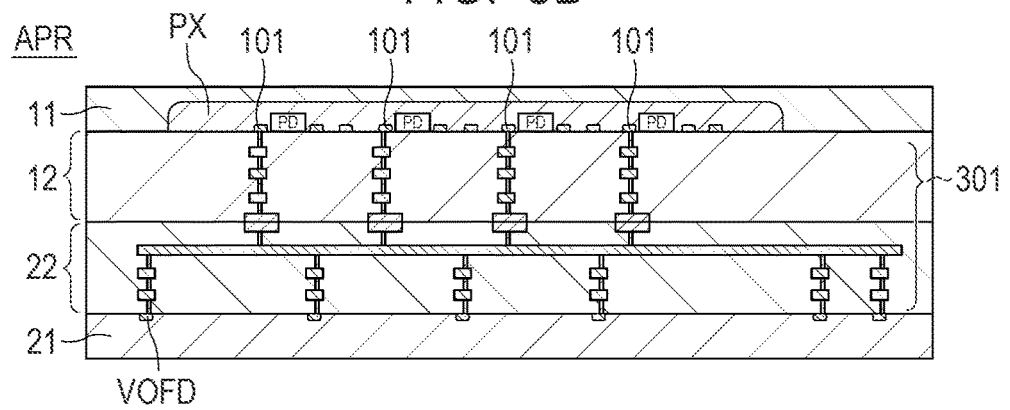

FIG. 5D is a view for illustrating the wiring line 301. The contacts 110 each correspond to the source/drain of the discharge transistor 101, and the contacts 210 each correspond to the discharge potential supplier VOFD. It is preferred to employ the Type F wiring line 300 for the discharge potential supplier VOFD connected to the discharge transistor 101. A plurality of discharge potential suppliers VOFD are connected to one discharge transistor 101 via one bonding portion 330. The discharge potential tends to have large fluctuations as described above, and coupling with another wiring line is therefore required to be reduced. For instance, lateral smearing and other characteristics may deteriorate when the wiring line 301 is coupled with a control line of a gate of a transistor placed on the chip 1. The wiring line 301 connected to the discharge potential suppliers VOFD is therefore desirably wired on the chip 2 to reduce the planar dimension for wiring to the chip 1. The wiring line 301 of FIG. 5D may also be, for example, the Type AF or Type Tu wiring line 300 in Table 2.

When the reference transistor 204 is included in the cell 10, the wiring line 300 (inter-chip wiring line) including at least one bonding portion 330 is provided instead of the wiring line 304 to connect the reference transistor 204 and the transistor 202. What is true for the wiring line 304 applies also to the wiring line 300 connecting the reference transistor 204 and the transistor 202. Specifically, the wiring line 300 connecting the reference transistor 204 and the transistor 202 is preferred to be one of Type A, Type D, Type F, and Type H, which are smaller in the number of bonding portions 330 (Y=S). However, the wiring line 300 connecting the reference transistor 204 and the transistor 202 may also be one of Type B, Type C, Type E, and Type G, depending on the chip layout. The selection may also be made based on the value of Y out of the types shown in Table 2.

When the reference transistor 204 is included in the cell 10, the ramp signal RAMP to be input to the gate of the reference transistor 204 may be transmitted along the wiring line 300 (inter-chip wiring line) including at least one bonding portion 330. The number of bonding portions 330 included in the wiring line 300 along which the ramp signal RAMP is transmitted may be set larger than the number of bonding portions 330 included in the wiring line 303 for efficient transmission of the ramp signal RAMP. For instance, one of Type B, Type C, Type E, and Type G may be chosen for the wiring line 300 connected to the reference transistor 204. The wiring line 300 connected to the source/drain of the reference transistor 204 in this case is one of Type A, Type D, Type F, and Type H as described above. When a reduction of cross talk between the ramp signal RAMP and another signal is given importance, the wiring line 300 connected to the gate of the reference transistor 204, too, may be selected from Type A, Type D, Type F, and Type H. While a case in which the ramp signal RAMP is transmitted along the wiring line 300 (inter-chip wiring line) including at least one bonding portion 330 is described here, the ramp signal RAMP may be transmitted only through the wiring layers of the wiring structure 12. Characteristics in the stacked-type semiconductor device APR can thus be improved by optimizing the combination of the number of contacts 110 of the chip 1 (X), the number of contacts 210 of the chip 2 (Z), and the number of bonding portions 330 (Y). In the description given above, the wiring lines 300 of Type A to Type H shown in Table 1 can be replaced as appropriate with the wiring lines 300 of Type AF to Type CG shown in Table 2 as long as the relation of interest between a contact and a connection portion is retained.

Figure 6A:
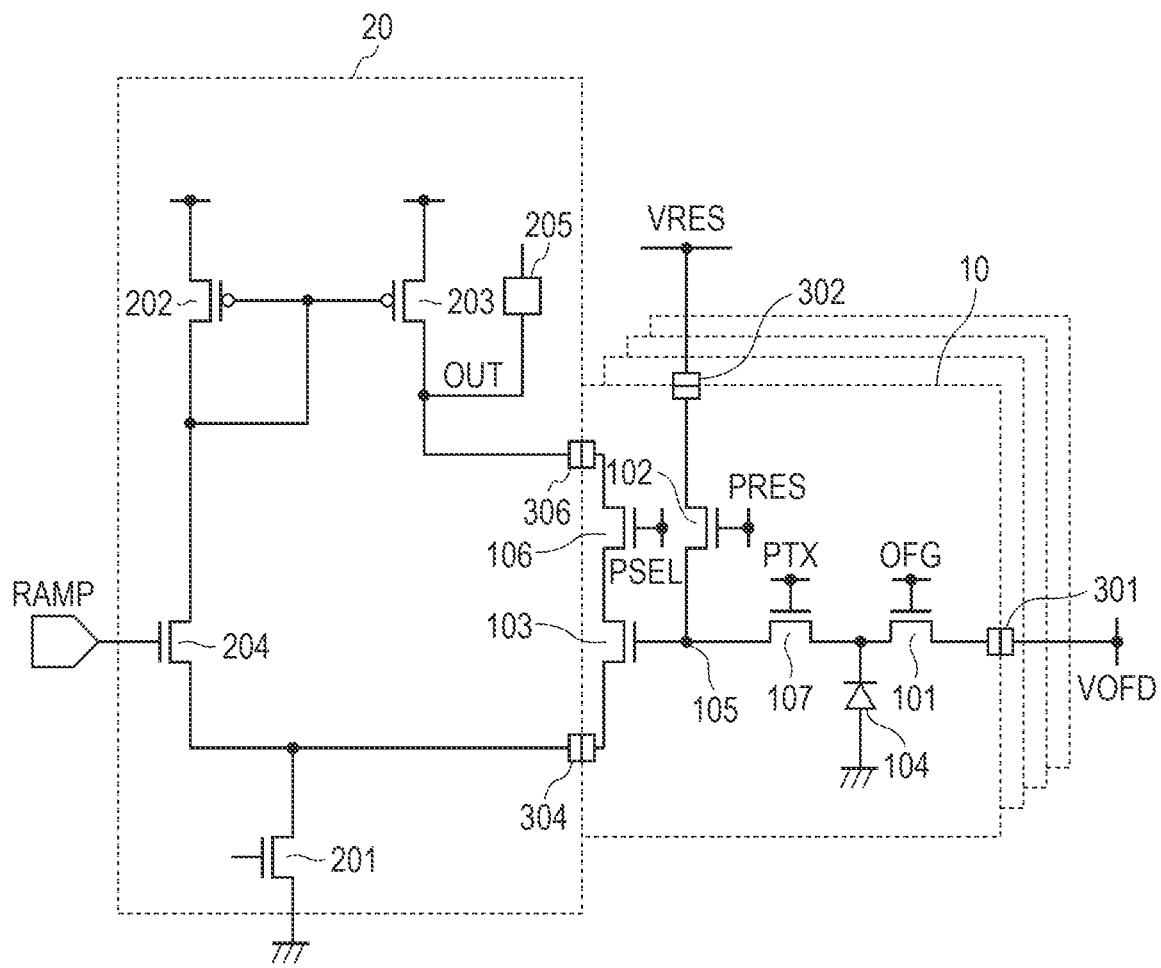
FIG. 6A and FIG. 6B are a diagram and a view for illustrating the semiconductor device.

In FIG. 6A, one cell 20 is shared by a plurality of cells 10. With the outputs of the plurality of cells 10 connected to one comparator, a measure to select an input signal is required and a selection transistor 106 is accordingly provided in each of the cells 10. The selection transistor 106 and the transistor 203 are connected by a wiring line 306. A reset potential and a discharge potential are supplied from the chip 2 as in the mode of FIG. 3.

Figure 6B:
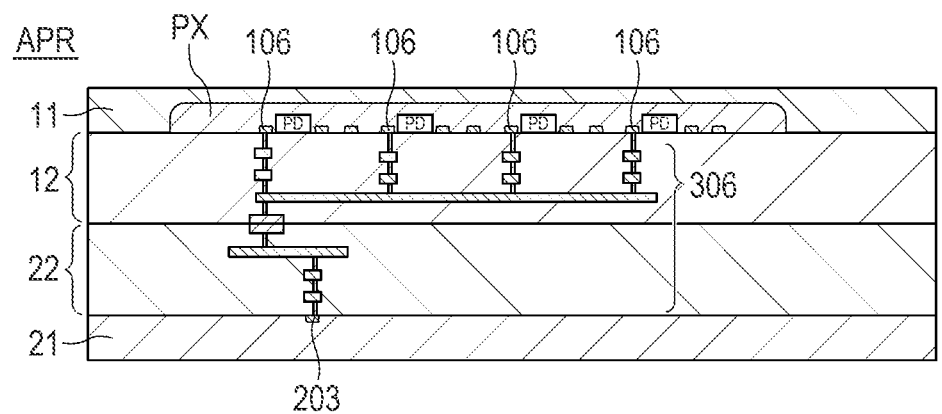

As illustrated in FIG. 6B, the Type D wiring line 300 is employed as the wiring line 306 along which an analog signal is transmitted. The contacts 110 of the chip 1 each correspond to the selection transistor 106 and the contacts 210 of the chip 2 each correspond to the transistor 203. One transistor 203 is connected to a plurality of selection transistors 106 via one bonding portion 330. The selection transistors 106, which are to be connected to the comparator, are placed in the cells 10. The wiring line 306, along which an analog signal is transmitted, desirably includes a minimum number of bonding portions 330 in order to reduce the parasitic capacitance. It is therefore desirable to use the wiring layers of the wiring structure 12 to connect sources/drains of the same node, specifically, sources/drains of the plurality of selection transistors 106.

Figure 7A:
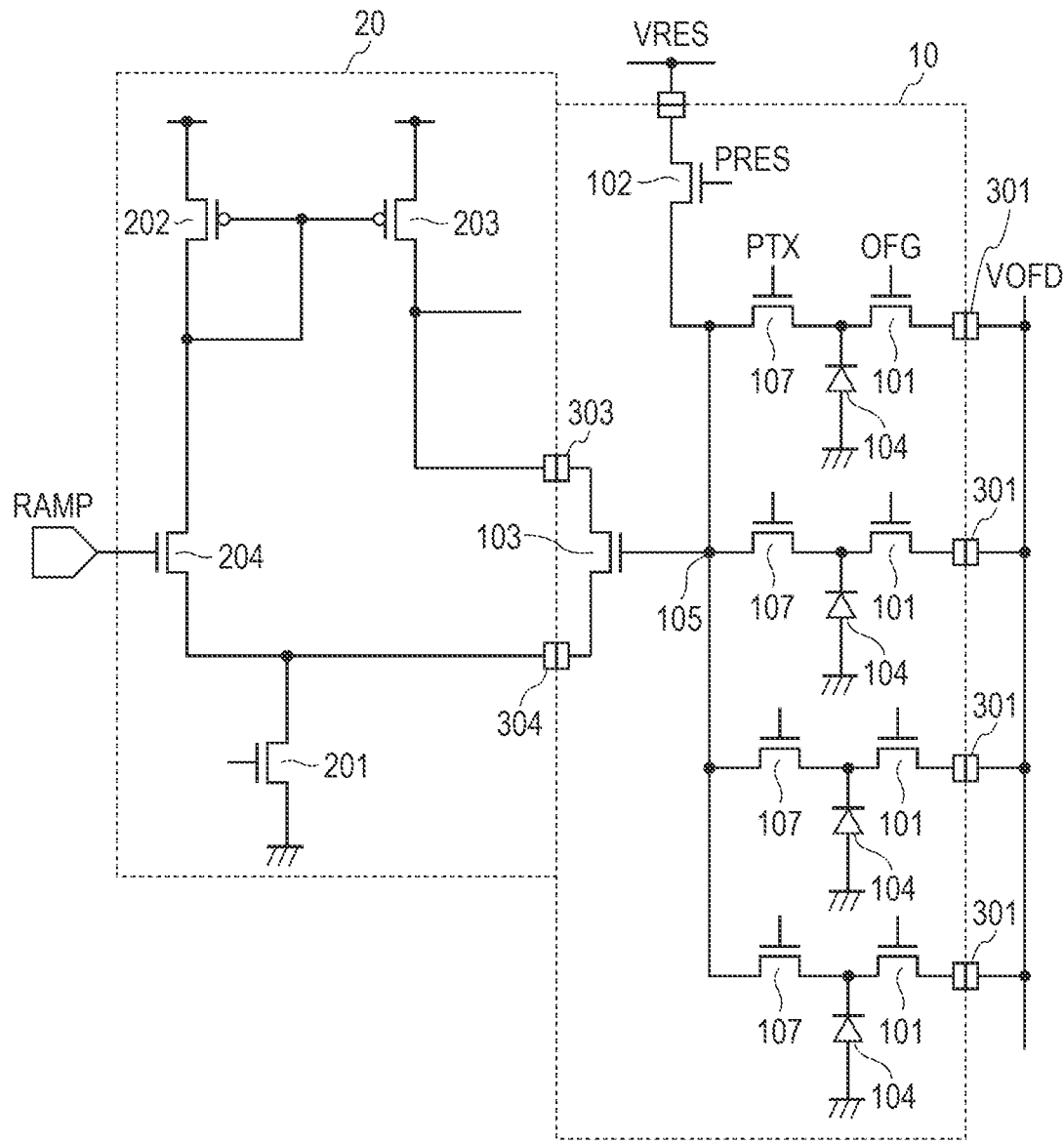
FIG. 7A and FIG. 7B are a diagram and a view for illustrating the semiconductor device.

FIG. 7A is an equivalent circuit diagram of another mode. In each cell 10, the detection transistor 103 is shared by a plurality of photoelectric converters 104. With this configuration, the number of bonding portions 330 required for the same number of photoelectric converters 104 can be reduced. The latch 205 illustrated in FIG. 3 and FIG. 6A is omitted from FIG. 7A.

Figure 7B:
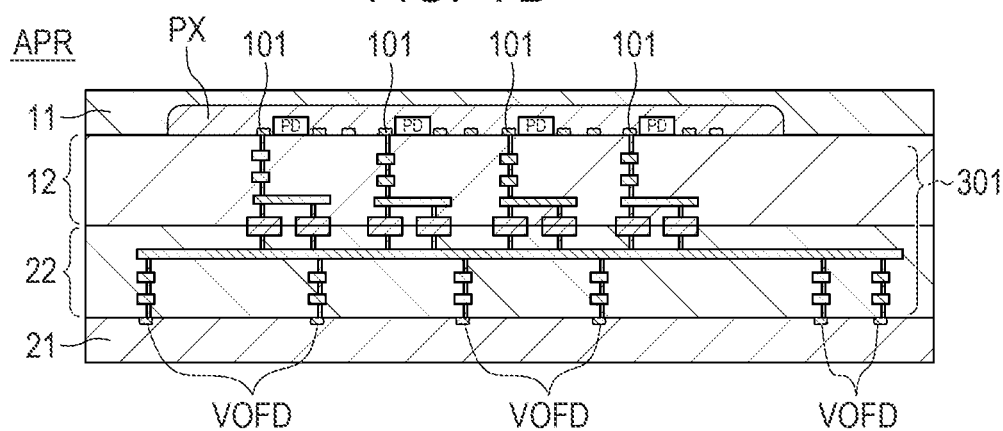

As illustrated in FIG. 7B, the Type DE wiring line 300 shown in Table 2 is employed as the wiring line 301. The contacts 110 of the chip 1 each correspond to the discharge transistor 101, and the contacts 210 of the chip 2 each correspond to the discharge potential suppliers VOFD. One discharge potential supplier VOFD is connected to a plurality of discharge transistors 101 via one bonding portion 330. The reduction in the number of bonding portions 330 lowers the wiring occupation ratio, which enables the semiconductor device to distribute the bonding portions 330 to a wiring line in which the resistance is required to be low. Through employment of the Type DE wiring line 300 as the wiring line 301 along which a discharge potential is supplied, the resistance is lowered and coupling with another control line is reduced as well. While one cell 20 is connected to one cell 10 that includes a plurality of photoelectric converters 104 in this example, one cell 20 may be shared by a plurality of cells 10 each including a plurality of photoelectric converters 104. In that case, however, a selection transistor is provided in each of the plurality of cells 10 as described above with reference to FIG. 6A and FIG. 6B. The wiring line 301 of FIG. 7B may also be Type E, Type V, or a similar type.

Figure 8A:
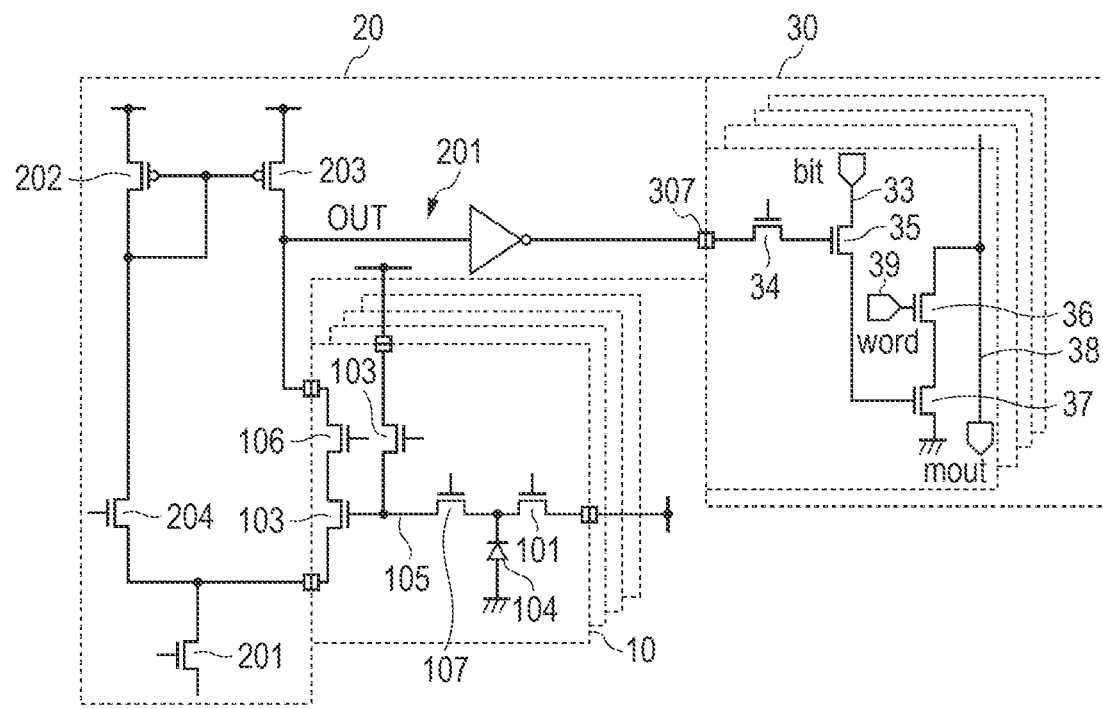
FIG. 8A and FIG. 8B are a diagram and a view for illustrating the semiconductor device.
Figure 8B:
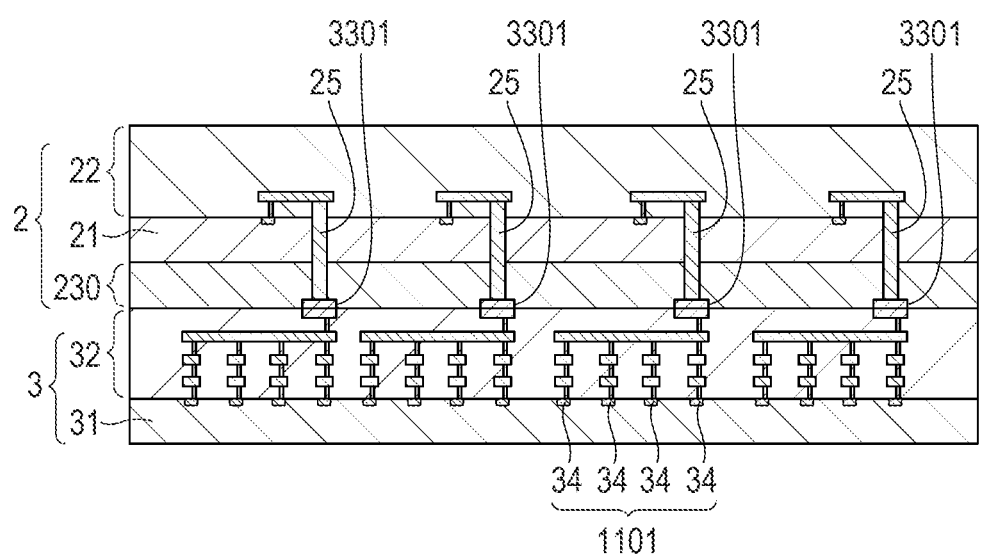

In a mode of FIG. 8A and FIG. 8B, the cells 10 are provided on the chip 1, the cells 20 are provided on the chip 2, and a chip 3 having an area in which a plurality of cells 30 including memories (memory cells) are arranged in matrix is included. The chips 1, 2, 3 are stacked so that the chip 2 is sandwiched between the chip 3 and the chip 1. The cells 30 each include transistors 34, 35, 36, and 37, which have connection relations illustrated in FIG. 8A.

A code value "0" or "1" is input to a bit line 33 of each cell 30. A code input signal is a bit signal, for example, a gray code. Data at the time when the output OUT of the comparator is inverted is stored in the cell 30. The stored signal is accessed when control is exerted with the use of a word line 39, and is read onto a signal line mout 38. This mode is also configured so that the output of the cell 20 is shared by a plurality of cells 30. The transistor 34 is a switching transistor. Through switching on of the transistor 34, the cell 30 to which the data is to be written can be selected out of a plurality of cells 30 connected to a shared through-electrode 25.

In FIG. 8B, the chip 3 includes a semiconductor layer 31 and a wiring structure 32, and has an area (not shown) in which the chip 3 overlaps with the chip 1 and the chip 2. The semiconductor layer 21 of the chip 2 is provided with a plurality of through-electrodes 25, which electrically connect the chip 2 and the chip 3, in the area 23 described above with reference to FIG. 1A. The chip 2 further includes an insulating film 230, which is interposed between the semiconductor layer 21 and the chip 3 and in which the through-electrodes 25 are provided.

Two or more (four) cells 30 out of the plurality of cells 30 provided on the chip 3 are connected to one through-electrode 25 out of the plurality of through-electrodes 25. The transistor 34 of each cell 30 serves as a contact between the chip 3 and a connection wiring line including one through-electrode 25. In this configuration, one bonding portion 3301 connects a plurality of contacts 1101 of the chip 3 to one through-electrode 25 of the chip 2. The through-electrodes 25 are large in size and inflict considerable damage to the semiconductor layer 21. It is therefore preferred to connect a plurality of cells 30 (transistors 34) to one through-electrode 25 in order to reduce the number of through-electrodes 25.

Figure 9A:
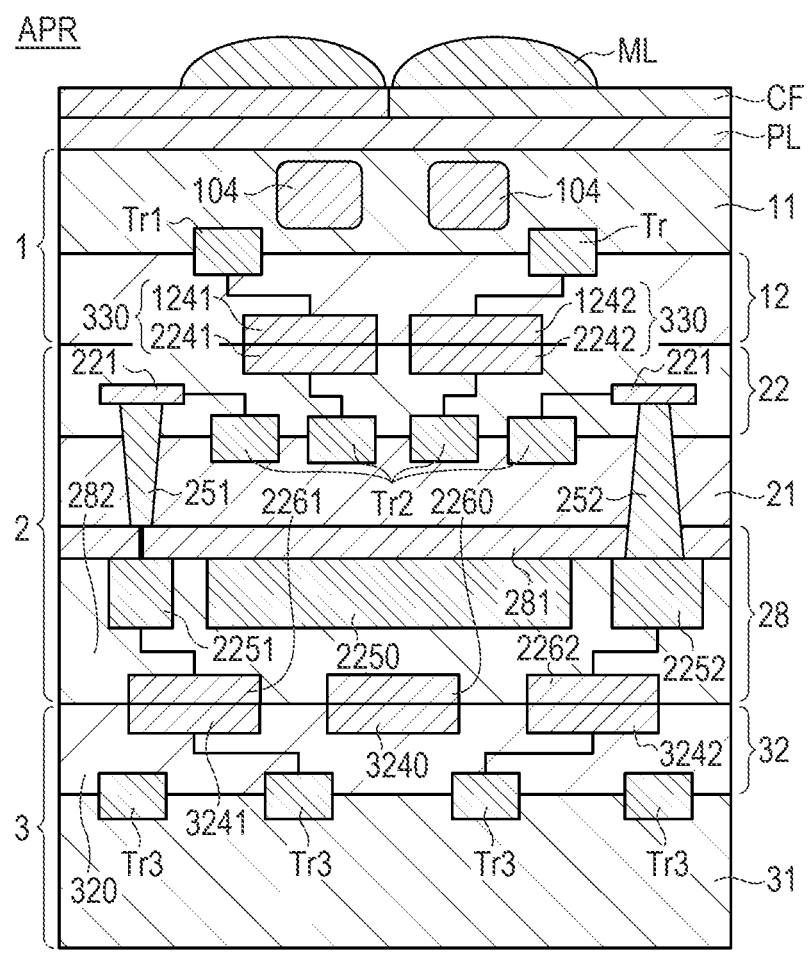
FIG. 9A and FIG. 9B are views for illustrating another semiconductor device.

FIG. 9A is a diagram for illustrating a semiconductor device in which the chips 1, 2, and 3 are stacked. In FIG. 9A, a simplified illustration of representative elements out of the elements described above is provided. Specifically, in FIG. 9A, the photoelectric converters 104 and a plurality of transistors TR1 are illustrated as elements provided on the chip 1. In FIG. 9A, a plurality of transistors TR2 and a plurality of transistors TR3 are illustrated as elements provided on the chip 2 and elements provided on the chip 3, respectively. The semiconductor device of FIG. 9A has a planarization layer PL, a color filter CF, and microlenses ML on a surface of the chip 1 opposite from the chip 2.

Through-electrodes 251 and 252 are provided as the through-electrodes 25, which pierce the semiconductor layer 21. Conductive patterns 2261 and 2262 are connected to the through-electrodes 251 and 252 through intermediation of conductive patterns 2251 and 2252, respectively. The chip 2 and the chip 3 are electrically connected by the bonding of the conductive patterns 2261 and 2262 and conductive patters 3241 and 3242, respectively, in addition to the through-electrodes 251 and 252. A conductive pattern 2260 and a conductive pattern 3240 are bonded to enhance the mechanical connection between the chips 2 and 3. Insulating films 281, 282, and 320 are formed around the patterns to insulate one pattern from another pattern.

A metal pattern 2250 larger in planar dimension than the planar dimensions of the bonding portions 330 between the chips 1 and 2 is provided between the semiconductor layer 21 of the chip 2 and the semiconductor layer 31 of the chip 3. A main component of the metal pattern 2250 is aluminum or copper.

The distance between the metal pattern 2250 and the semiconductor layer 21 is less than the thickness of the semiconductor layer 21. Heat generated in the semiconductor layer 11 and transmitted to the semiconductor layer 21 via the bonding portions 330 may cause noise and fluctuations in characteristics in the cells 10 of the semiconductor layer 11. The semiconductor layer 21 is set thin (e.g., 1 µm to 50 µm) in order to provide the through-electrodes 25 (251 and 252) therein, and hence heat is hardly conducted inside the semiconductor layer 21. Through placement of the metal pattern 2250, which has a large planar dimension, close to the semiconductor layer 21, the metal pattern 2250 dissipates heat in the semiconductor layer 21.

Figure 9B:
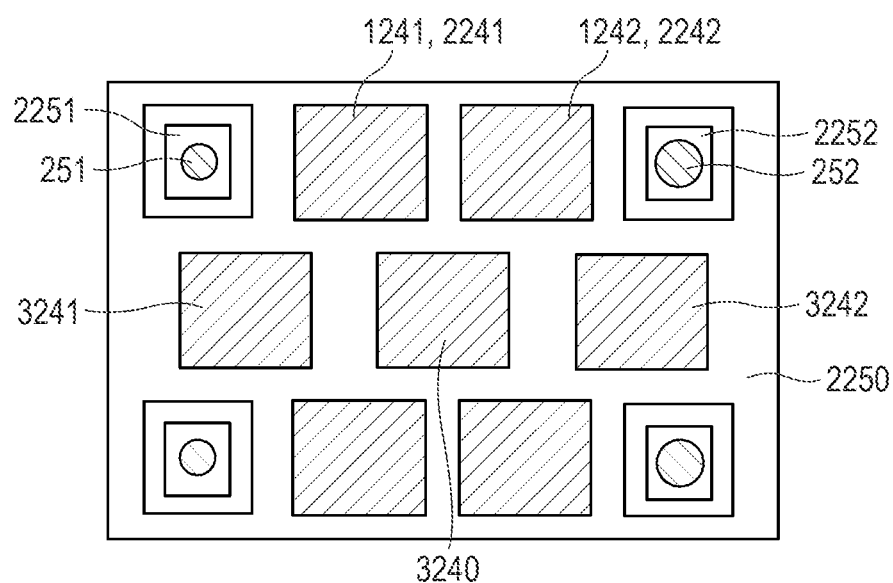

FIG. 9B is a view for schematically illustrating an overlap between any patterns of FIG. 9A. For example, FIG. 9B is created by projecting any patterns onto a plane that includes the plane of bonding between the chip 1 and the chip 2. The any patterns are the through-electrodes 251 and 252, the conductive patterns 2251 and 2252, the metal pattern 2250, and a plurality of bonding portions 330. The plurality of bonding portions 330 are the conductive patterns 3241 (2261), 3242 (2262), 1241 (2241), and 1242 (2242).

In FIG. 9B, the metal pattern 2250 is provided so as to cover the entire plane, and has a plurality of openings. The conductive patterns 2251 and 2252 for transmitting signals supplied from the through-electrodes 251 and 252 are provided in the plurality of openings. An insulator electrically isolates the metal pattern 2250 from the conductive patterns 2251 and 2252. The planar dimension of the metal pattern 2250 is larger than the planar dimension of the bonded conductive patterns 3241 (2261), 3242 (2262), 1241 (2241), and 1242 (2242), which form a plurality of bonding portions. This is because the metal pattern 2250 is tasked to dissipate heat. The through-electrodes 251 and 252 do not overlap with the conductive patterns 3241 (2261), 3242 (2262), 1241 (2241), and 1242 (2242) in FIG. 9B.

A method of manufacturing the semiconductor device APR of FIG. 9A is illustrated in FIG. 10A to FIG. 11D. In FIG. 10A to FIG. 11D, a member before processing and the member after the processing are denoted by the same reference symbol in order to simplify the description. The reference symbols of the finished chips are read as reference symbols of wafers in FIG. 10A to FIG. 11D. For instance, the chip 1 is read as a first wafer 1. The first wafer 1 provided with a plurality of photoelectric converters is prepared in FIG. 10A. A plurality of transistors are provided.

Figure 10A:
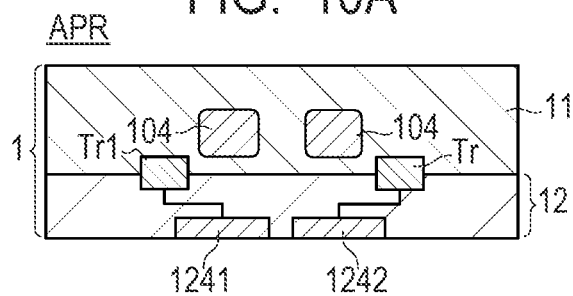
FIG. 10A, FIG. 10B, FIG. 10C, FIG. 10D, FIG. 10E, FIG. 10F, and FIG. 10G are views for illustrating the semiconductor device of FIG. 9A and FIG. 9B.
Figure 10B:
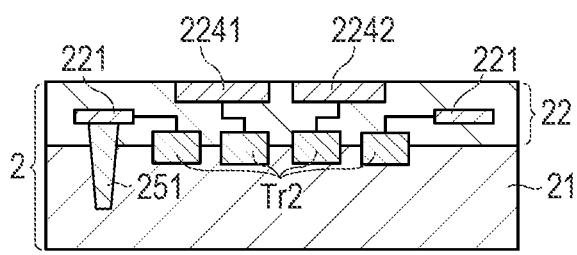

First, as illustrated in FIG. 10A and FIG. 10B, the first wafer 1, which includes the semiconductor layer 11 and the wiring structure 12, and a second wafer 2, which includes the semiconductor layer 21 and the wiring structure 22, are prepared. The semiconductor layer 11 is provided with a plurality of photoelectric converters, and the wiring structure 12 includes a first conductive pattern. The semiconductor layer 21 is provided with a plurality of transistors, and the wiring structure 22 includes a second conductive pattern. The first conductive pattern and the second conductive pattern are, for example, patterns containing copper.

Figure 10C:
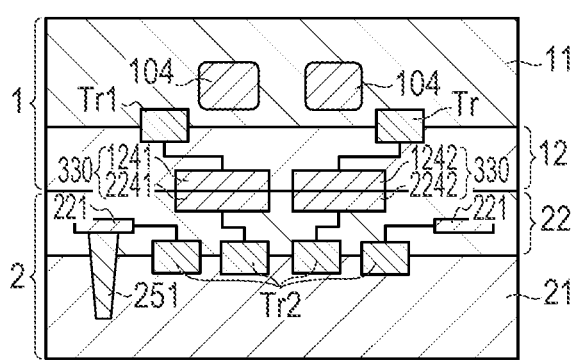

The first wafer 1 and the second wafer 2 are then stuck together (a first step). In FIG. 10C, the wafers are stuck so that the first conductive pattern of the first wafer 1 and the second conductive pattern of the second wafer 2 are bonded to each other.

Figure 10D:
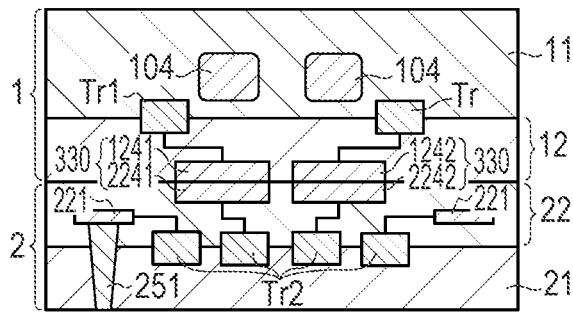

After the sticking step, the second wafer 2 is thinned as illustrated in FIG. 10D (a second step). The second wafer 2 is thinned with the use of the first wafer 1 as a support substrate by any thinning method, for example, CMP, dry etching, or wet etching. The thickness of the second wafer 2 to be reached by the thinning is set in view of mechanical strength.

Figure 10E:
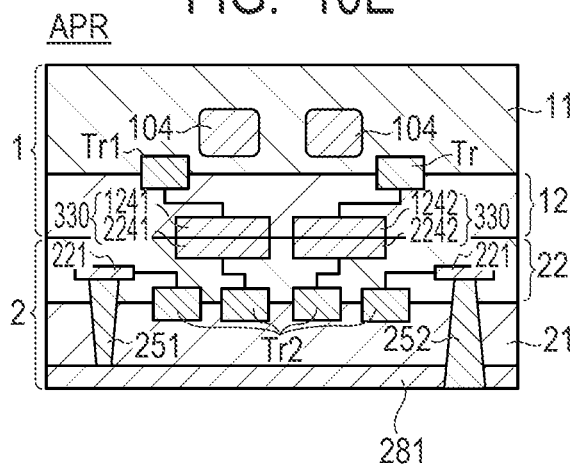
Figure 10F:
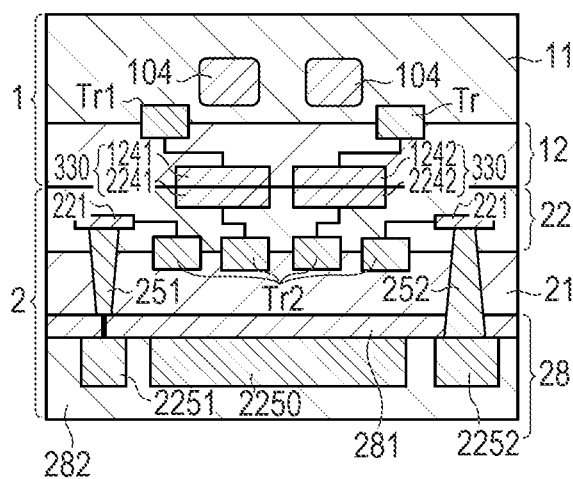

After the thinning step, the through-electrodes 25 are formed in the second wafer 2 as illustrated in FIG. 10E. After the through-electrode 251 is formed, the insulating film 281 is formed to form the through-electrode 252 and an electrode for connection to the through-electrode 251. The through-electrodes 251 and 252, which have different structures and are formed separately in FIG. 10E, may have the same structure to be formed simultaneously. A configuration without the through electrodes 251 and 252 may also be employed. The through-electrodes 251 and 252 are formed from any conductive material, for example, tungsten or copper. The step of forming the through-electrodes 25 may be executed before the step of thinning the second wafer 2.

After the thinning step, the metal pattern 2250 and the conductive patterns 2251 and 2252 are formed (a third step). The metal pattern 2250 and the conductive patterns 2251 and 2252 are formed on the side of the second wafer 2 that is opposite from the first wafer 1. The metal pattern 2250 is formed in a place in which the metal pattern 2250 overlaps with the first conductive pattern and the second conductive pattern as described above with reference to FIG. 9B. It can also be said that the metal pattern 2250 is formed in a place in which the metal pattern 2250 overlaps with the first conductive pattern and the second conductive pattern in a top-bottom direction of FIG. 10F.

Figure 10G:
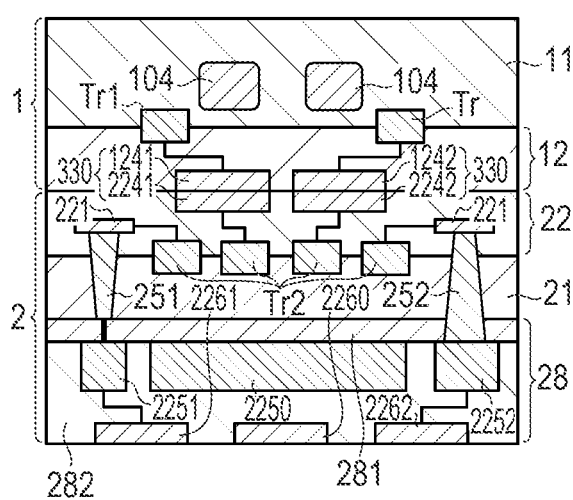

Next, as illustrated in FIG. 10G, the conductive patterns 2260, 2261, and 2262 are formed on the side of the second wafer 2 that is opposite from the first wafer 1. The conductive patterns 2260, 2261, and 2262 are, for example, patterns containing copper.

Figure 11A:
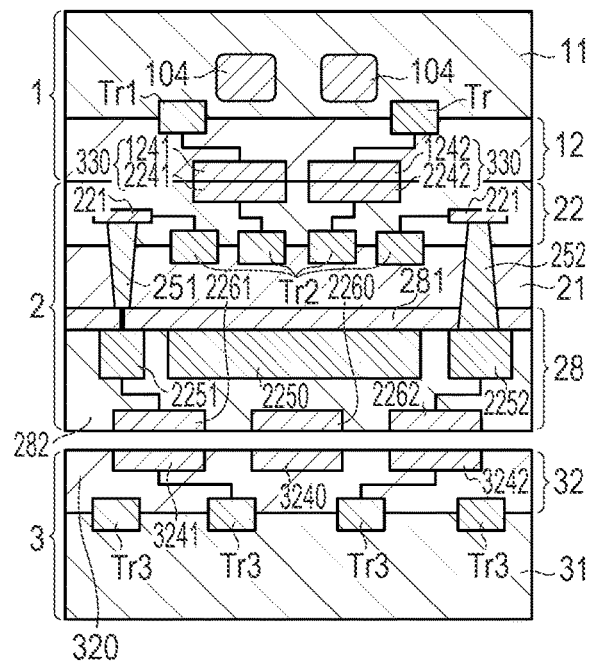
FIG. 11A, FIG. 11B, FIG. 11C, and FIG. 11D are views for illustrating the semiconductor device of FIG. 9A and FIG. 9B.

After the metal pattern 2250 is formed, the third wafer 3 including the semiconductor layer 31 and the wiring structure 32 is prepared. The semiconductor layer 31 is provided with a memory and the wiring structure 32 includes a third conductive pattern (FIG. 11A).

Figure 11C:
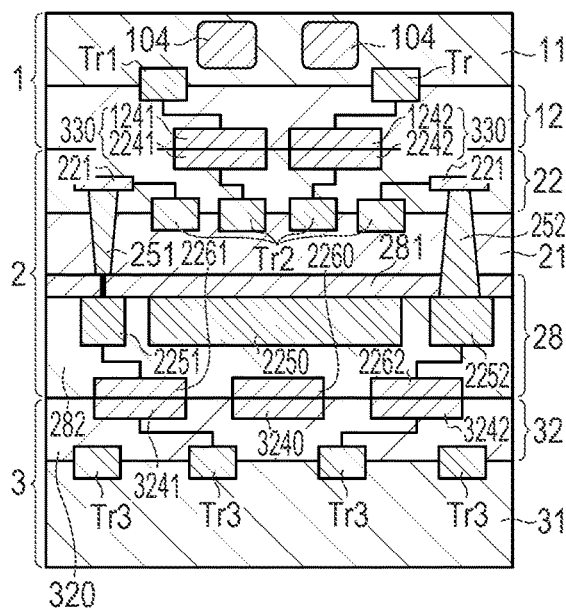
Figure 11B:
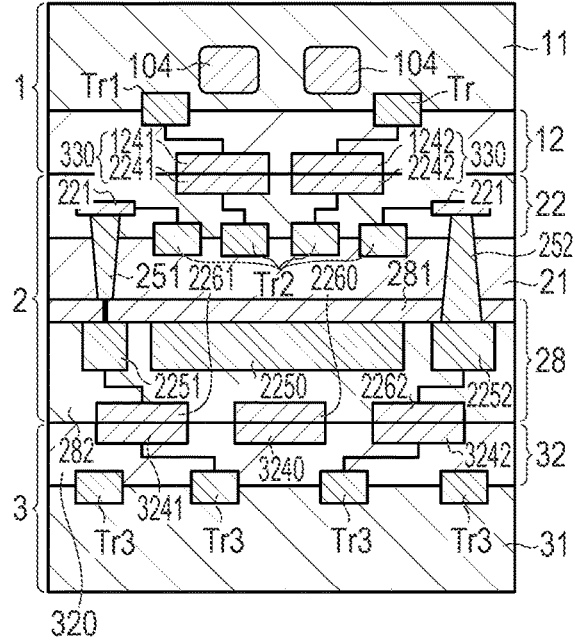

As illustrated in FIG. 11B, the second wafer 2 and the third wafer 3 are stuck together (a fourth step). The third wafer 3 and the second wafer 2 are stuck so that the metal pattern 2250 is positioned. The through-electrodes 251 and 252 and the third conductive pattern of the third wafer 3 are electrically connected at this point.

After the sticking, the first wafer 1 is thinned (as illustrated in FIG. 11C, a fifth step). The first wafer 1 is thinned with the use of the second wafer 2 and the third wafer 3 as a support substrate by any thinning method, for example, CMP, dry etching, or wet etching. The thickness of the first wafer 1 to be reached by the thinning is set in view of light-receiving sensitivity of photoelectric conversion elements and mechanical strength in a range of from 1 μm to 10 μm, and is set to 3 μm in this case.

Figure 11D:
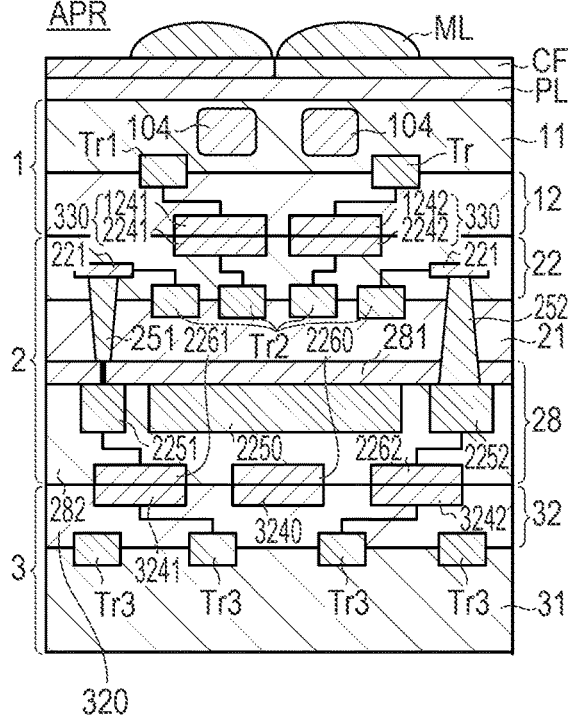

As illustrated in FIG. 11D, the planarization layer PL, the color filter CF, and the microlenses ML are formed. Other components, including an opening (not shown) for a connection portion (pad) for connection to the outside, are also formed to complete the semiconductor device APR. According to this manufacturing method, in which conductive patterns formed on the first wafer 1 and the second wafer 2 are bonded when the wafers are stuck together, a semiconductor device high in positioning precision can be manufactured.

In the description given above, the thickness of the second wafer 2 to be reached by the thinning is set in view of mechanical strength. The thickness to be reached may be set so that the distance from the semiconductor layer 21 to the metal pattern 2250 is shorter than the distance from the semiconductor layer 21 to the second conductive pattern, which includes the conductive patterns 2241 and 2242 of the bonding portions 330, in view of the dissipation of heat. The thickness to be reached may also be set so that the distance from the semiconductor layer 21 to the metal pattern 2250 is less than the thickness of the semiconductor layer 21.

While the third wafer 3 is stuck after the first wafer 1 and the second wafer 2 are stuck together in this example, the second wafer 2 and the third wafer 3 may be stuck together first. In that case, the second wafer 2 is thinned with the third wafer 3 as a support substrate. The through-electrodes 25 and the second conductive pattern, which includes the conductive patterns 2241 and 2242, are then formed in the second wafer 2. The first wafer 1 is stuck to this second wafer 2, and is thinned with the second wafer 2 and the third wafer 3 as a support substrate. The subsequent steps are executed in the same manner as in the case of sticking the first wafer 1 and the second wafer 2 first, thereby completing the manufacture of the semiconductor device APR. According to this method, in which the first wafer 1 is not used as a support substrate, no extra stress or heat load is applied, and the dark current and the like can accordingly be reduced.

While the second wafer 2 is interposed between the first wafer 1 and the third wafer 3 in the configuration described in this example, the third wafer 3 may be interposed between the first wafer 1 and the second wafer 2. It is preferred to provide the metal pattern 2250 in this case, too.

Figure 12:
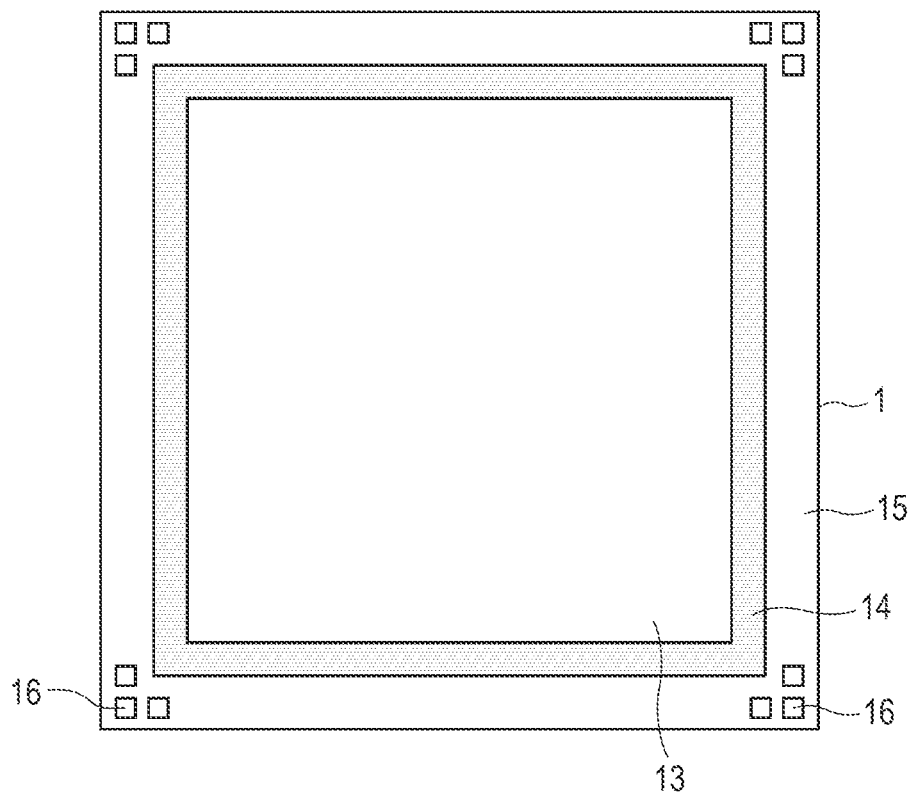
FIG. 12 is a view for illustrating still another semiconductor device.
Figure 12:
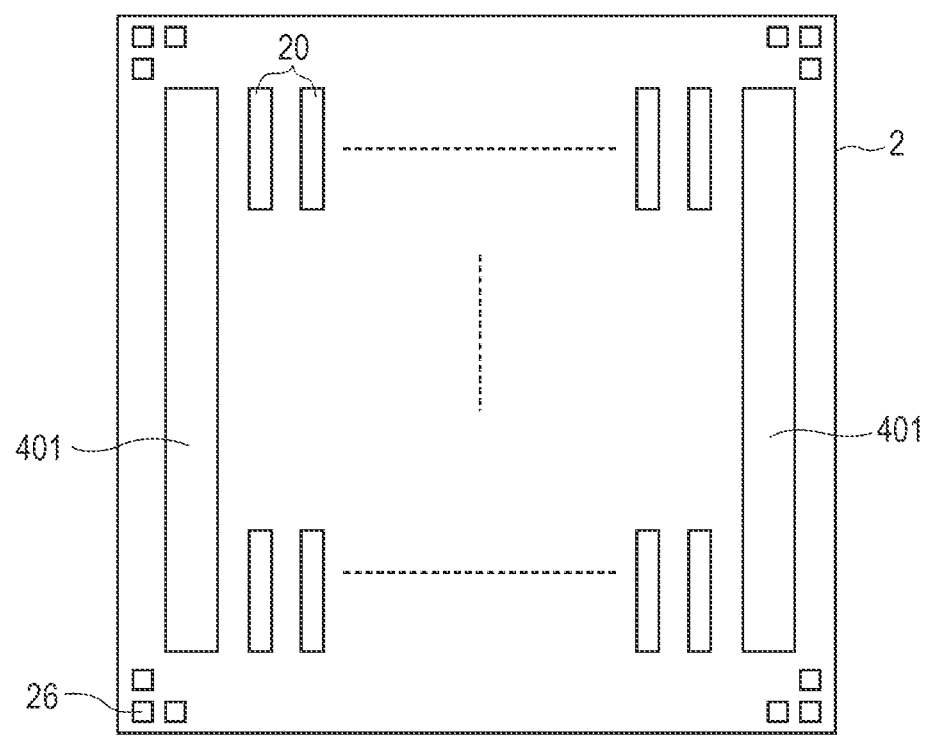

FIG. 12 is a schematic diagram for illustrating, in plan view, the layouts of the chips 1 and 2. The chip 1 has the area 13, in which the cells 10 (not shown) are arranged, and an area 14 and an area 15, which are placed outside the area 13. Contacts for supplying a voltage to the semiconductor layer of the chip 1 are placed in the area 14. In this case, a ground voltage is supplied to the semiconductor layer. Contacts for fixing the electric potential of the semiconductor layer of the chip 1, for example, are provided in the area 15. Areas 16 are placed in the four corners of the chip 1. The areas 16 are portions used for connection to another chip and to the outside.

In FIG. 12, the chip 2 has the area 23 (not shown), in which the cells 20 are arranged, and a circuit area 401 placed outside the area 23. A scanning circuit for driving the cells 20, for example, is placed in the circuit area 401. Areas 26 are placed in the four corners of the chip 2. The areas 26, too, are portions used for connection to another chip and to the outside.

Figure 13A:
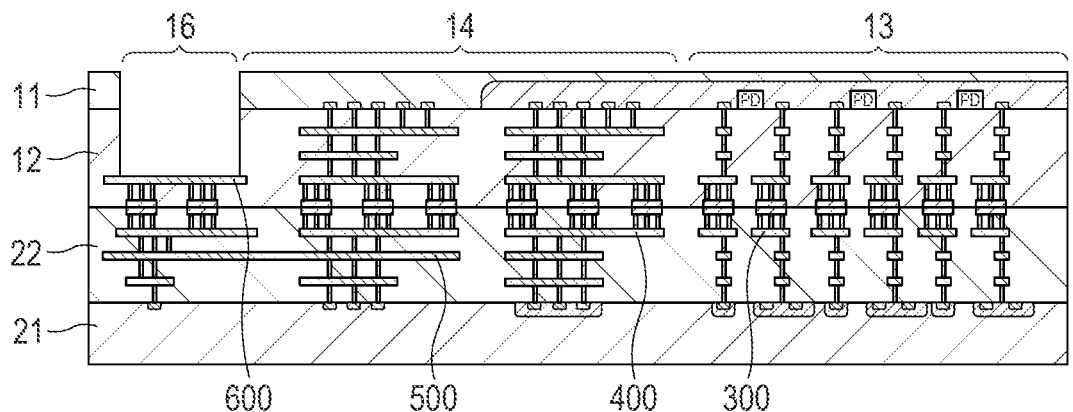
FIG. 13A, FIG. 13B, and FIG. 13C are views for illustrating the semiconductor device of FIG. 12.
Figure 13B:
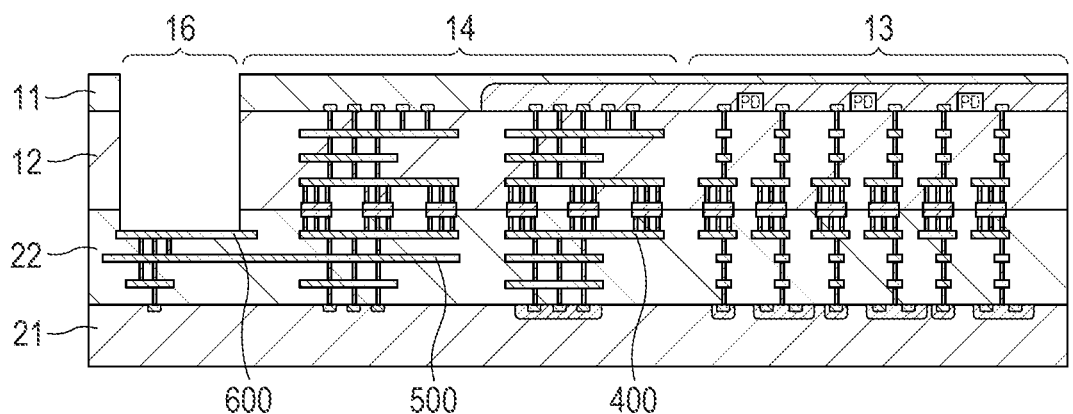
Figure 13C:
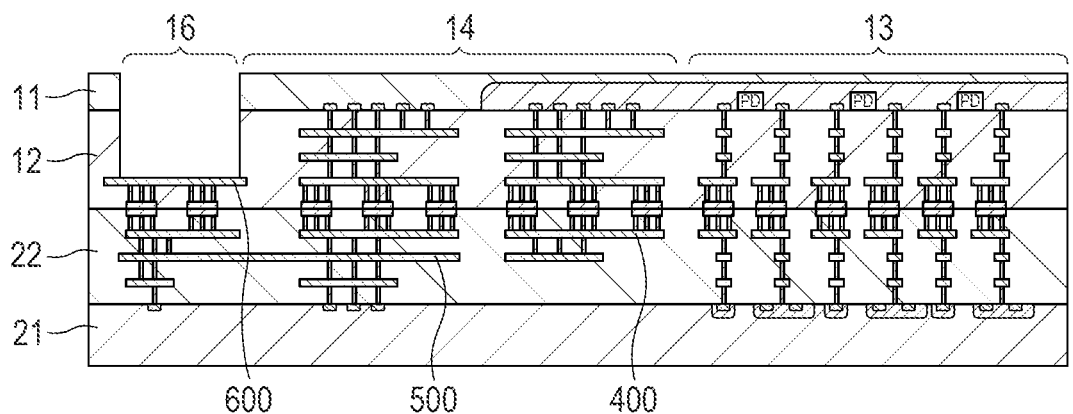

FIG. 13A to FIG. 13C are sectional views of the chips 1 and 2 illustrated in FIG. 12 and stacked on top of each other, and the area 13, the area 14, and one of the areas 16 in the chip 1 are illustrated in FIG. 13A to FIG. 13C. The chip 2 includes patterns 300, which lead to bonding portions of the area 13, patterns 400, which lead to bonding portions of the area 14, and a pattern 500, which stretches from the area 14 to the area 16. The patterns 300, 400, and 500 are made from a conductor and form wiring lines. An opening is formed in the area 16 to expose a pattern 600, which is made from a conductor and is used for connection to an external element. A protective circuit and other components may be provided in the area 16.

FIG. 13B and FIG. 13C are modification examples of FIG. 13A. FIG. 13B differs from FIG. 13A in the position of the pattern 600, and the pattern 600 in FIG. 13B is provided in the second chip. FIG. 13C differs from FIG. 13A in elements provided in a portion of the chip 2 that corresponds to the area 14.

As illustrated in FIG. 13A to FIG. 13C, a plurality of bonding portions 330 are provided in an area from the area 14 to the area 16 as well. This configuration improves the uniformness of patterns throughout the planes of the chips, and consequently improves the levelness in manufacture. The resistance of an electrical path along which a constant voltage such as a power supply voltage and a ground voltage is supplied can be lowered as well. For wiring lines to be used in the bonding portions 330 in the area 14 and the area 16, suitable wiring lines may be selected from the types of wiring lines shown in Table 1 and Table 2.

On the chip 1, the ratio of the areas 14, 15, and 16 to the area 13 in terms of the planar dimension of the bonding portions in a 1,000 µm×1,000 µm area is 0.5 or more and 1.5 or less. An even more preferred range of the ratio is 0.8 or more and 1.2 or less. The ratio of the areas 14, 15, and 16 to the area 13 in terms of the number of bonding portions in a 100 µm×100 µm area is 0.5 or more and 1.5 or less.

A plan-view shape preferred for a pattern having a large planar dimension, for example, the patterns 500 and 400 of FIG. 13A to FIG. 13C, is a meandering shape or a ladder shape. This is because the preferred shape improves the levelness in CMP treatment.

The equipment EQP illustrated in FIG. 1B is described next in detail. As described above, the photoelectric conversion device APR may include, in addition to the semiconductor device IC, the package PKG, in which the semiconductor device IC is housed. The package PKG may contain a substrate to which the semiconductor device IC is fixed, a cover made of glass or the like and opposed to the semiconductor device IC, and a connection member, for example, a bonding wire or a bump, by which a terminal provided on the substrate and a terminal provided on the semiconductor device IC are connected.

The equipment EQP may further include at least one of the optical system OPT, the controller CTRL, the processor PRCS, the display DSPL, the memory MMRY, and the mechanical device MCHN. The optical system OPT forms an image on the photoelectric conversion device APR, and includes, for example, a lens, a shutter, and a mirror. The controller CTRL controls the photoelectric conversion device APR, and is an ASIC or a similar semiconductor device. The processor PRCS processes a signal output from the photoelectric conversion device APR, and forms an analog front end (AFE) or a digital front end (DFE). The processor PRCS is a central processing unit (CPU), an application-specific integrated circuit (ASIC), or a similar semiconductor device. The display DSPL is an EL display or a liquid crystal display for displaying information (an image) obtained by the photoelectric conversion device APR. The memory MMRY is a magnetic device or a semiconductor device for storing information (an image) obtained by the photoelectric conversion device APR. The memory MMRY is a volatile memory, for example, an SRAM or a DRAM, or a non-volatile memory, for example, a flash memory or a hard disk drive. The mechanical device MCHN includes a movable unit or a propelling unit, for example, a motor or an engine. In the equipment EQP, a signal output from the photoelectric conversion device APR is displayed on the display DSPL and is transmitted to the outside by a communication device (not shown) included in the equipment EQP. It is therefore preferred for the equipment EQP to include the memory MMRY and the processor PRCS separately from a storage circuit and arithmetic circuit included in the photoelectric conversion device APR.

The equipment EQP illustrated in FIG. 1B may be an information terminal having a photographing function (e.g., a smartphone or a wearable terminal), a camera (e.g., an interchangeable lens camera, a compact camera, a video camera, or a monitoring camera), or similar electronic equipment. The mechanical device MCHN in a camera may be used to drive parts of the optical system OPT for zooming, focusing, and shutter operation. The equipment EQP may also be transportation equipment (a moving vehicle), for example, a vehicle, a ship, or a flight vehicle.

The equipment EQP may also be medical equipment, for example, an endoscope or a CT scanner.

The mechanical device MCHN in transportation equipment may be used as a moving device. The equipment EQP as transportation equipment is suitable for the transportation of the photoelectric conversion device APR, or for the assistance and/or automation of driving (operation) with the use of a photographing function. The processor PRCS for the assistance and/or automation of driving (operation) may execute processing for operating the mechanical device MCHN as a moving device based on information obtained by the photoelectric conversion device APR.

The photoelectric conversion device APR in the embodiment can provide high value to its designer, manufacturer, seller, purchaser, and/or user. The value of the equipment EQP in which the photoelectric conversion device APR is installed is accordingly enhanced in value as well. The decision to install the photoelectric conversion device APR in the embodiment in the equipment EQP in the manufacture and sales of the equipment EQP is therefore advantageous to the enhancement of the value of the equipment EQP.

Any configurations in the examples described herein may be combined and modified to suit individual purposes. The semiconductor device described herein is not limited to CMOS image sensors, and is applicable to semiconductor device provided with at least two light receiving elements (photoelectric conversion elements).

According to the present disclosure, a semiconductor device of improved performance is provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A semiconductor device comprising:
a first chip and a second chip, the first chip and the second chip being stacked on top of each other, the first chip having a first area, in which a plurality of first cells are arranged in matrix, the second chip having a second area, in which an electric circuit is arranged,
wherein a plurality of wiring lines electrically connects the first chip and the second chip, each of the plurality of wiring lines includes a bonding portion for bonding one of a plurality of conductive patterns placed in the first chip and one of a plurality of conductive patterns placed in the second chip,
wherein the plurality of first cells each includes a photoelectric converter, a charge detector which detects an electric charge of the photoelectric converter, a transfer gate which transfers an electric charge of the photoelectric converter to the charge detector, and a reset transistor which resets an electric potential of the charge detector,
wherein the number of bonding portions included in a first wiring line out of the plurality of wiring lines is larger than the number of bonding portions included in a second wiring line out of the plurality of wiring lines,
wherein at least one of the bonding portions included in the first wiring line and the bonding portions included in the second wiring line is arranged in an overlap area, in which the first area and the second area overlap, and
wherein the first wiring line is connected to one of a source and a drain of the reset transistor.

2. The semiconductor device according to claim 1, wherein a ratio of a number of transistors of the first chip connected to the first wiring line to the number of bonding portions included in the first wiring line is higher than a ratio of the number of transistors of the second chip connected to the second wiring line to the number of bonding portions included in the second wiring line.

3. The semiconductor device according to claim 1, wherein a ratio of the number of contacts between the first wiring line and a semiconductor layer of the first chip to the number of bonding portions included in the first wiring line is different from a ratio of the number of contacts between the second wiring line and a semiconductor layer of the second chip to the number of bonding portions included in the second wiring line.

4. The semiconductor device according to claim 1,
wherein the electric circuit includes a part of a comparator, which includes a differential pair, and
wherein the detection transistor is one of transistors of the differential pair.

5. The semiconductor device according to claim 4, wherein the plurality of first cells each includes another transistor out of the transistors of the differential pair.

6. The semiconductor device according to claim 5,
wherein the another transistor is connected to a third wiring line, which is one of the plurality of wiring lines in the overlap area, and
wherein the number of bonding portions included in the third wiring line is larger than the number of bonding portions included in the second wiring line.

7. The semiconductor device according to claim 6, further comprising:
a fourth wiring line provided around the overlap area, and
wherein the number of bonding portions included in the fourth wiring line is larger than the number of bonding portions included in the second wiring line.

8. The semiconductor device according to claim 7, wherein a ratio of the number of contacts between the fourth wiring line and a semiconductor layer of the first chip to the number of bonding portions included in the fourth wiring line is higher than a ratio of the number of contacts between the second wiring line and a semiconductor layer of the second chip to the number of bonding portions included in the second wiring line.

9. The semiconductor device according to claim 8,
wherein the semiconductor layer of the first chip has an opening formed therein,
wherein one of the first chip and the second chip includes an electrode positioned below the opening, and
wherein the fourth wiring line is connected to the electrode.

10. The semiconductor device according to claim 1, further comprising:
a third chip, the third chip having a third area, in which a plurality of third cells are arranged in matrix,
wherein the first chip, the second chip, and the third chip are stacked so as to sandwich the second chip between the third chip and the first chip, wherein the second area and the third area overlap in the overlap area, and a semiconductor layer of the second chip in the overlap area is provided with a plurality of through-electrodes electrically connect the second chip and the third chip, and
wherein at least two third cells out of the plurality of third cells provided in the third chip are connected to one through-electrode out of the plurality of through-electrodes.

11. The semiconductor device according to claim 1, wherein the bonding portions included in the first wiring line and the bonding portions included in the second wiring line are arranged in the overlap area.

12. The semiconductor device according to claim 11,
wherein a plurality of second cells are arranged in matrix within the second area, and
wherein each of the plurality of second cells includes the electric circuit.

13. The semiconductor device according to claim 1,
wherein the one of the plurality of conductive patterns placed in the first chip forms a part of the top of the first chip, and
wherein the one of the plurality of conductive patterns placed in the second chip forms a part of the top of the second chip.

14. The semiconductor device according to claim 1, wherein each of the plurality of wiring lines includes the one of the plurality of conductive patterns placed in the first chip and the one of the plurality of conductive patterns placed in the second chip.

15. An image pickup system comprising:
the semiconductor device according to claim 1; and
a circuit board.

16. The image pickup system according to claim 15, wherein the image pickup system is a smartphone, a wearable terminal, or a transportation equipment.

17. The image pickup system according to claim 15, further comprising:
a display unit for displaying image information obtained from the semiconductor device.

18. The semiconductor device according to claim 1, wherein the first wiring line is shared by two or more first cells out of the plurality of first cells.

19. A semiconductor device comprising:
a first chip and a second chip, the first chip and the second chip being stacked on top of each other, the first chip having a first area, in which a plurality of first cells are arranged in matrix, the second chip having a second area, in which an electric circuit is arranged,
wherein a plurality of wiring lines electrically connect the first chip and the second chip, each of the plurality of wiring lines includes a bonding portion for bonding one of a plurality of conductive patterns placed in the first chip and one of a plurality of conductive patterns placed in the second chip,
wherein the plurality of first cells each includes a photoelectric converter, a charge detector which detects an electric charge of the photoelectric converter, a transfer gate which transfers an electric charge of the photoelectric converter to the charge detector, and a reset transistor which resets an electric potential of the charge detector,
wherein the number of bonding portions included in a first wiring line out of the plurality of wiring lines is larger than the number of bonding portions included in a second wiring line out of the plurality of wiring lines,
wherein at least one of the bonding portions included in the first wiring line and the bonding portions included in the second wiring line is arranged in an overlap area, in which the first area and the second area overlap, and
wherein the second wiring line is connected to one of a source and a drain of the reset transistor.

20. The semiconductor device according to claim 19, wherein a ratio of a number of transistors of the first chip connected to the first wiring line to the number of bonding portions included in the first wiring line is different from a ratio of the number of transistors of the second chip connected to the second wiring line to the number of bonding portions included in the second wiring line.

21. The semiconductor device according to claim 19, wherein a ratio of the number of contacts between a first wiring line, which is one of the plurality of wiring lines, and a semiconductor layer of the first chip to the number of bonding portions included in the first wiring line is higher than a ratio of the number of contacts between a second wiring line, which is one of the plurality of wiring lines, and a semiconductor layer of the second chip to the number of bonding portions included in the second wiring line.

22. An image pickup system comprising:
the semiconductor device according to claim 19; and
a circuit board.

23. The image pickup system according to claim 22, wherein the image pickup system is a smartphone, a wearable terminal, or a transportation equipment.

24. The image pickup system according to claim 22, further comprising:
a display unit for displaying image information obtained from the semiconductor device.

25. A semiconductor device comprising:
a first chip and a second chip, the first chip and the second chip being stacked on top of each other, the first chip having a first area, in which a plurality of first cells are arranged in matrix, the second chip having a second area, in which an electric circuit is arranged,
wherein a plurality of wiring lines electrically connect the first chip and the second chip, each of the plurality of wiring lines includes a bonding portion for bonding one of a plurality of conductive patterns placed in the first chip and one of a plurality of conductive patterns placed in the second chip,
wherein the plurality of first cells each includes a photoelectric converter, a charge detector which detects an electric charge of the photoelectric converter, a transfer gate which transfers an electric charge of the photoelectric converter to the charge detector, and a discharge transistor which discharges the electric charge of the photoelectric converter,
wherein the number of bonding portions included in a first wiring line out of the plurality of wiring lines is larger than the number of bonding portions included in a second wiring line out of the plurality of wiring lines,
wherein at least one of the bonding portions included in the first wiring line and the bonding portions included in the second wiring line is arranged in an overlap area, in which the first area and the second area overlap, and
wherein the first wiring line is connected to one of a source and a drain of the discharge transistor.

26. The semiconductor device according to claim 25, wherein a ratio of a number of transistors of the first chip connected to the first wiring line to the number of bonding portions included in the first wiring line is different from a ratio of the number of transistors of the second chip connected to the second wiring line to the number of bonding portions included in the second wiring line.

27. The semiconductor device according to claim 25, wherein a ratio of the number of contacts between a first wiring line, which is one of the plurality of wiring lines, and a semiconductor layer of the first chip to the number of bonding portions included in the first wiring line is higher than a ratio of the number of contacts between a second wiring line, which is one of the plurality of wiring lines, and a semiconductor layer of the second chip to the number of bonding portions included in the second wiring line.

28. An image pickup system comprising:
the semiconductor device according to claim 25; and
a circuit board.

29. The image pickup system according to claim 28, wherein the image pickup system is a smartphone, a wearable terminal, or a transportation equipment.

30. The image pickup system according to claim 28, further comprising:
a display unit for displaying image information obtained from the semiconductor device.

* * * * *